United States Patent
Yu

(10) Patent No.: US 11,675,962 B2
(45) Date of Patent: *Jun. 13, 2023

(54) VERTEX-BASED OPC FOR OPENING PATTERNING

(71) Applicant: TAIWAN SEMICONDUCTOR MANUFACTURING COMPANY, LTD., Hsinchu (TW)

(72) Inventor: Shinn-Sheng Yu, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/712,974

(22) Filed: Apr. 4, 2022

(65) Prior Publication Data

US 2022/0229968 A1 Jul. 21, 2022

Related U.S. Application Data

(63) Continuation of application No. 17/144,975, filed on Jan. 8, 2021, now Pat. No. 11,295,056.

(Continued)

(51) Int. Cl.
*G06F 30/398* (2020.01)
*G03F 1/36* (2012.01)
(Continued)

(52) U.S. Cl.
CPC .............. *G06F 30/398* (2020.01); *G03F 1/36* (2013.01); *G03F 7/70441* (2013.01)

(58) Field of Classification Search
None
See application file for complete search history.

(56) References Cited

U.S. PATENT DOCUMENTS

| | | | | |
|---|---|---|---|---|
| 7,313,780 B2 * | 12/2007 | Khoh | ....................... | G03F 1/36 716/55 |
| 7,571,418 B2 * | 8/2009 | Krasnoperova | ........... | G03F 1/36 716/55 |

(Continued)

OTHER PUBLICATIONS

Non-Final Office Action issued in U.S. Appl. No. 17/144,975 dated Jun. 23, 2021.

(Continued)

*Primary Examiner* — Leigh M Garbowski
(74) *Attorney, Agent, or Firm* — McDermott Will & Emery LLP

(57) ABSTRACT

A method of enhancing a layout pattern includes determining a target layout pattern comprising a disk shape associated with a hole. The method includes defining a polygon having a plurality of vertices on the disk shape. The plurality of vertices coincide with a boundary of the disk shape and the polygon is an initial layout pattern of the hole. The method includes performing an iterative correction of the initial layout pattern. The iterative correction includes projecting the layout pattern of the hole onto a substrate, determining an error between the target layout pattern and the projected layout pattern, and adjusting the layout pattern by moving the vertices of the polygon to generate a next iteration of the layout pattern. The method includes continuing the adjusting, projecting, and determining until a criterion is satisfied and a final iteration of the layout pattern of the hole is generated.

20 Claims, 19 Drawing Sheets

Related U.S. Application Data

(60) Provisional application No. 62/968,361, filed on Jan. 31, 2020.

(51) Int. Cl.
 *G03F 7/20* (2006.01)
 *G03F 7/00* (2006.01)

(56) References Cited

U.S. PATENT DOCUMENTS

| | | | |
|---|---|---|---|
| 7,600,212 B2 * | 10/2009 | Zach | G03F 1/36 716/54 |
| 7,849,423 B1 * | 12/2010 | Yenikaya | G03F 1/36 716/55 |
| 8,796,666 B1 | 8/2014 | Huang et al. | |
| 8,954,899 B2 | 2/2015 | Wu et al. | |
| 9,093,530 B2 | 7/2015 | Huang et al. | |
| 9,367,655 B2 | 6/2016 | Shih et al. | |
| 9,390,217 B2 | 7/2016 | Wang et al. | |
| 9,548,303 B2 | 1/2017 | Lee et al. | |
| 9,594,862 B2 | 3/2017 | Lin et al. | |
| 9,679,100 B2 | 6/2017 | Cheng et al. | |
| 9,865,542 B2 | 1/2018 | Liaw et al. | |
| 9,870,443 B2 | 1/2018 | Huang et al. | |
| 10,534,255 B2 | 1/2020 | Quaglio et al. | |
| 10,816,893 B2 * | 10/2020 | Wan | G06F 30/398 |
| 2018/0267399 A1 | 9/2018 | Quaglio et al. | |
| 2020/0081352 A1 * | 3/2020 | Kim | G06F 30/30 |

OTHER PUBLICATIONS

Notice of Allowance issued in U.S. Appl. No. 17/144,975 dated Nov. 19, 2021.

\* cited by examiner

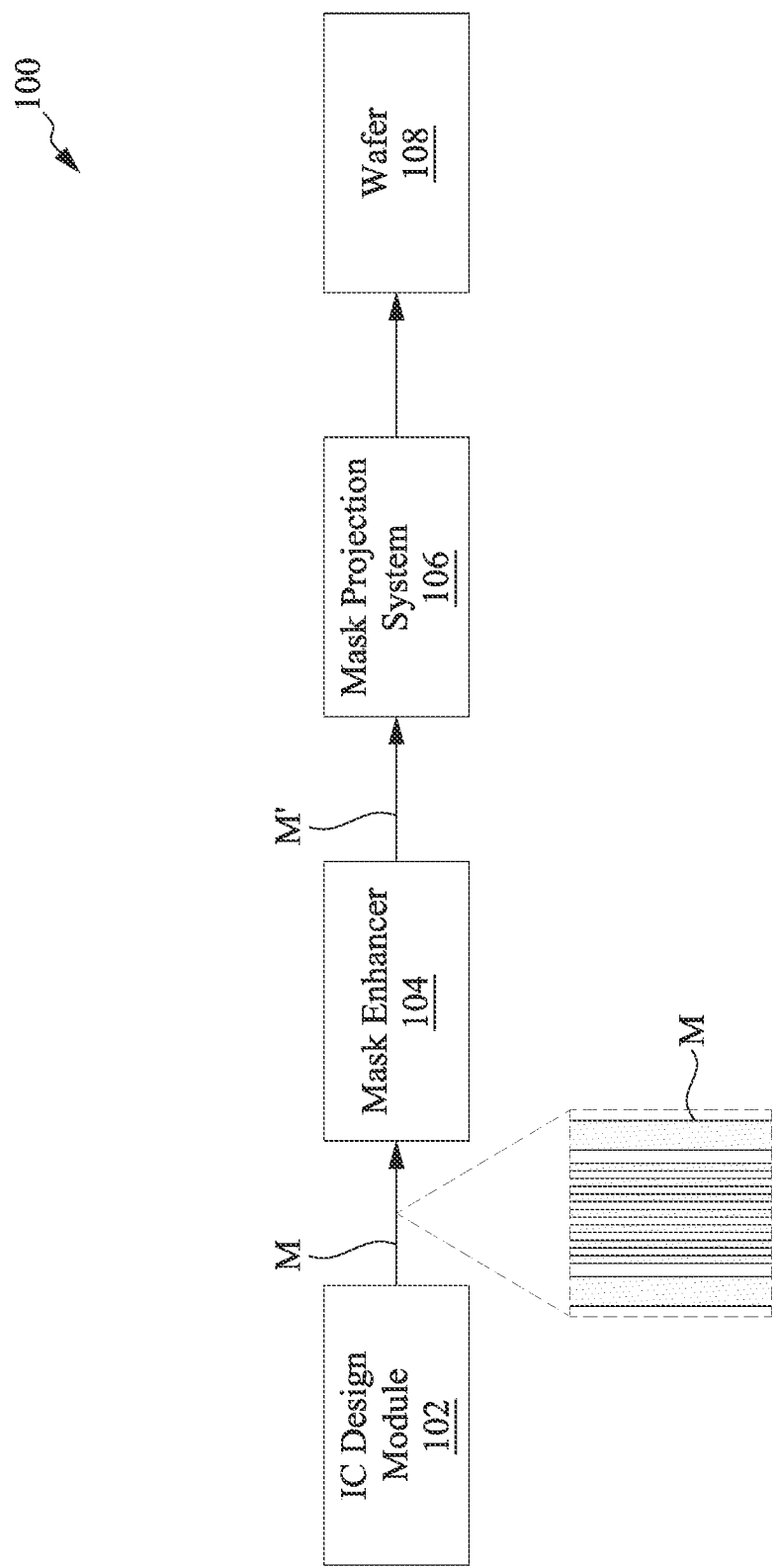

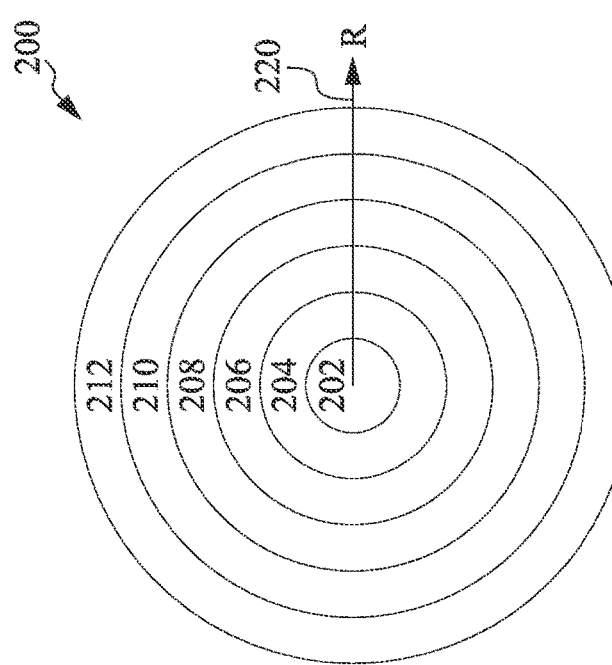
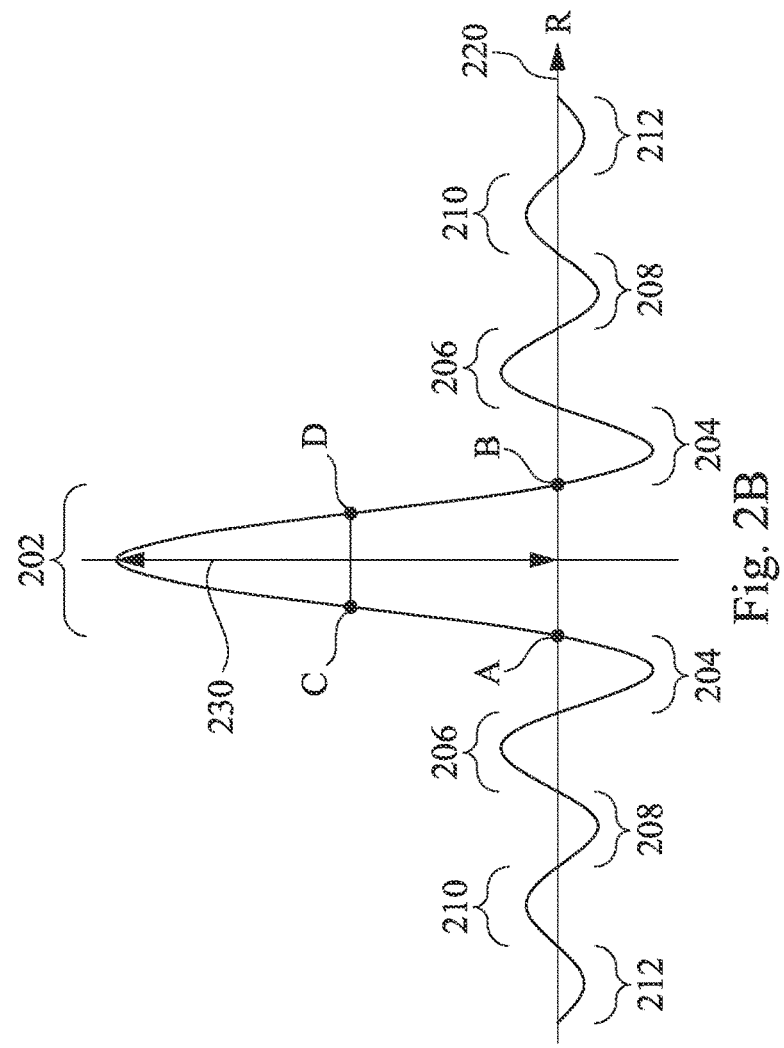

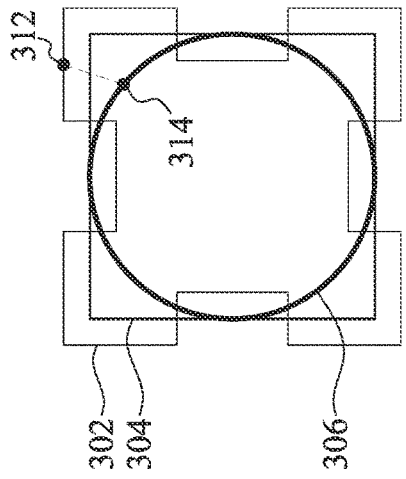
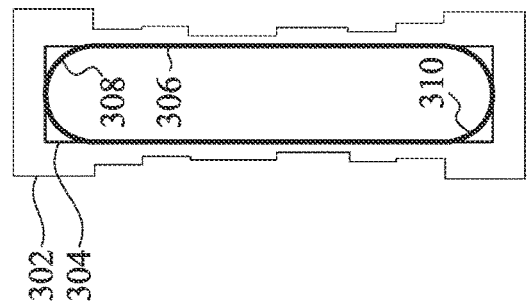
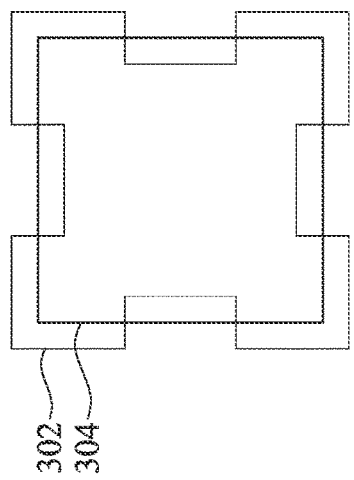
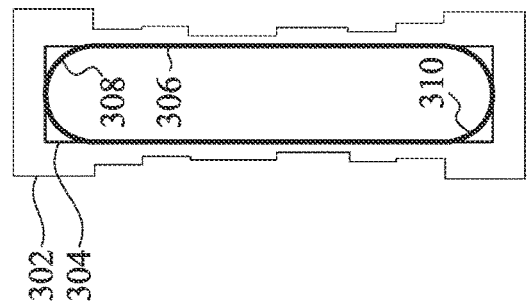

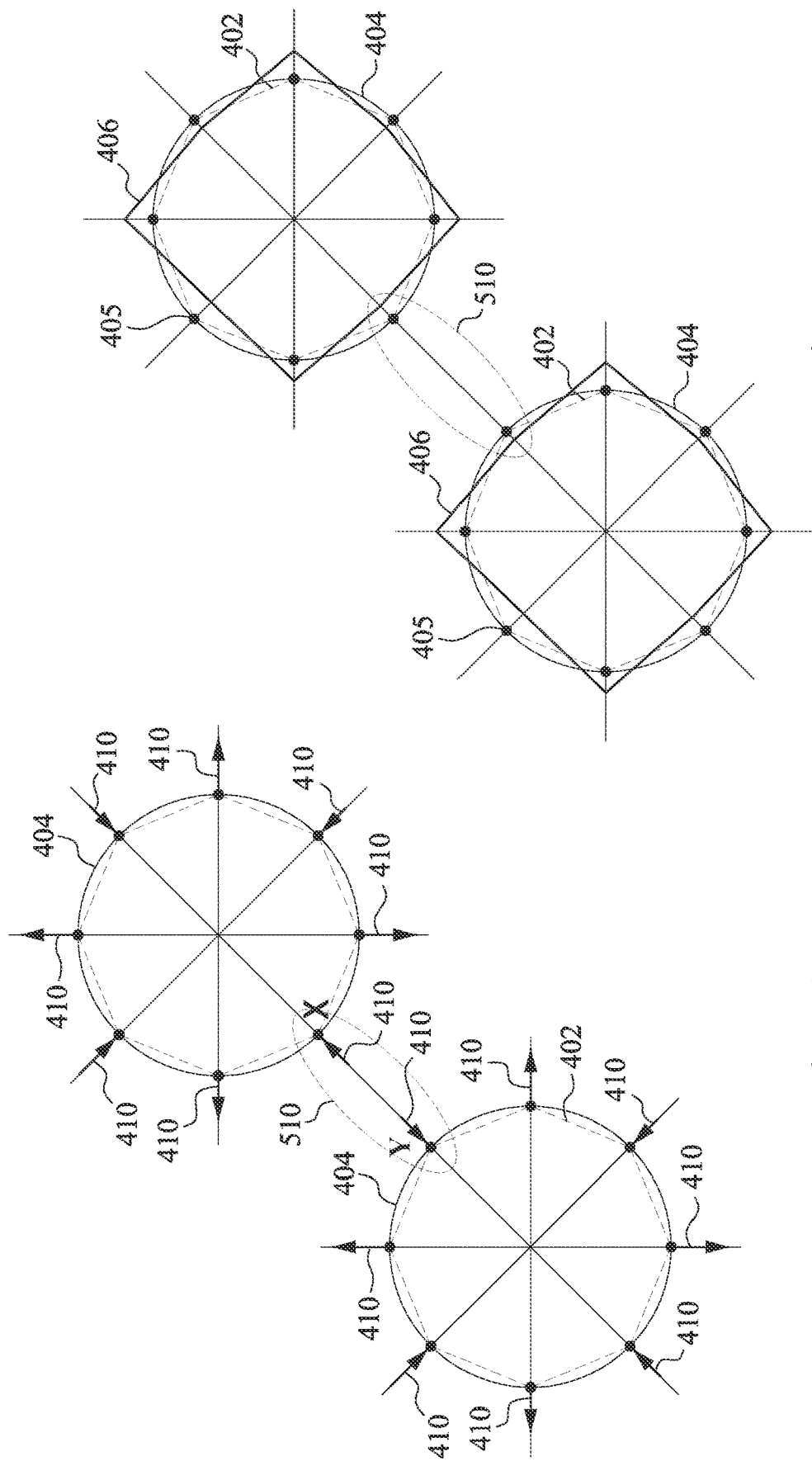

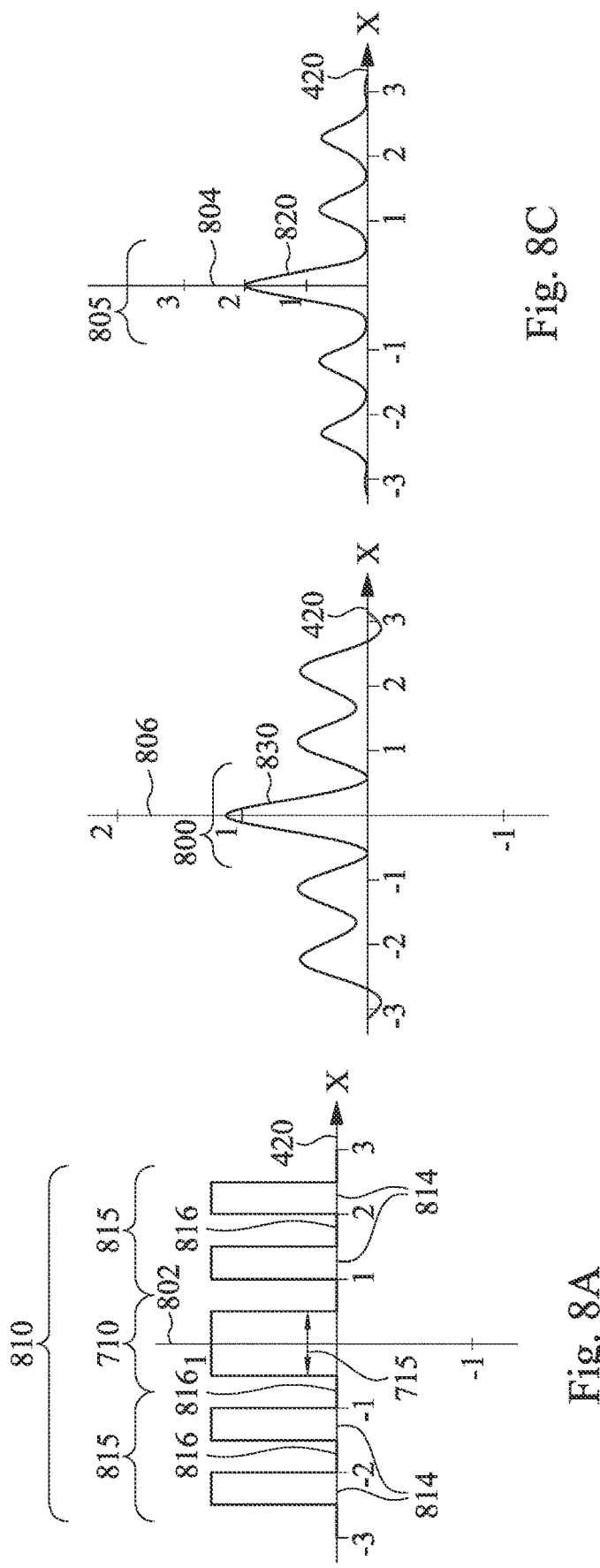

VERTEX-BASED OPC FOR OPENING PATTERNING

PRIORITY CLAIM AND CROSS-REFERENCE

This application is a continuation of U.S. application Ser. No. 17/144,975 filed on Jan. 8, 2021, now U.S. Pat. No. 11,295,056, which claims priority to U.S. Provisional Application No. 62/968,361 filed on Jan. 31, 2020, the entire disclosure of both applications is incorporated herein by reference.

BACKGROUND

An optical lithography process transfers a layout pattern of a photo mask to the wafer such that etching, implantation, or other steps are applied only to predefined regions of the wafer. Transferring the layout pattern of the photo mask to the resist layer on the wafer may cause resist pattern defects that are a major challenge in semiconductor manufacturing. An optical proximity correction (OPC) operation may be applied to the layout pattern of the photo mask to reduce the resist pattern defects. The OPC may modify the layout patterns of the photo mask before the lithography process to compensate for the effect of the lithography process. An efficient OPC operation on the layout patterns of openings (e.g., holes, trenches, L-shaped/U-shaped recesses), corners, and end of connection lines of the photo masks is desirable to reduce the defects in the resist pattern of the openings, corners, and end of connection lines produced on the wafer.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A illustrates a schematic diagram of an exemplary integrated circuit (IC) fabrication flow.

FIGS. 2A and 2B show cross-sectional views of a point spread function (PSF) of an imaging system of a photo lithographic system.

FIGS. 3A, 3B, 3C, and 3D illustrate OPC enhanced layout patterns and the resist patterns produced on a wafer.

FIGS. 5A and 5B illustrate layout pattern of adjacent openings and the OPC enhanced layout patterns of the adjacent openings in accordance with some embodiments of the present disclosure.

FIGS. 8A, 8B, and 8C illustrate an enhanced layout pattern of a photo mask that includes additional sub-resolution assist features, an amplitude of the light when the enhanced layout pattern is imaged on a resist layer on a wafer, and an intensity of the light when the enhanced layout pattern is imaged on the resist layer on the wafer in accordance with some embodiments of the disclosure.

DETAILED DESCRIPTION

Figure 1B:
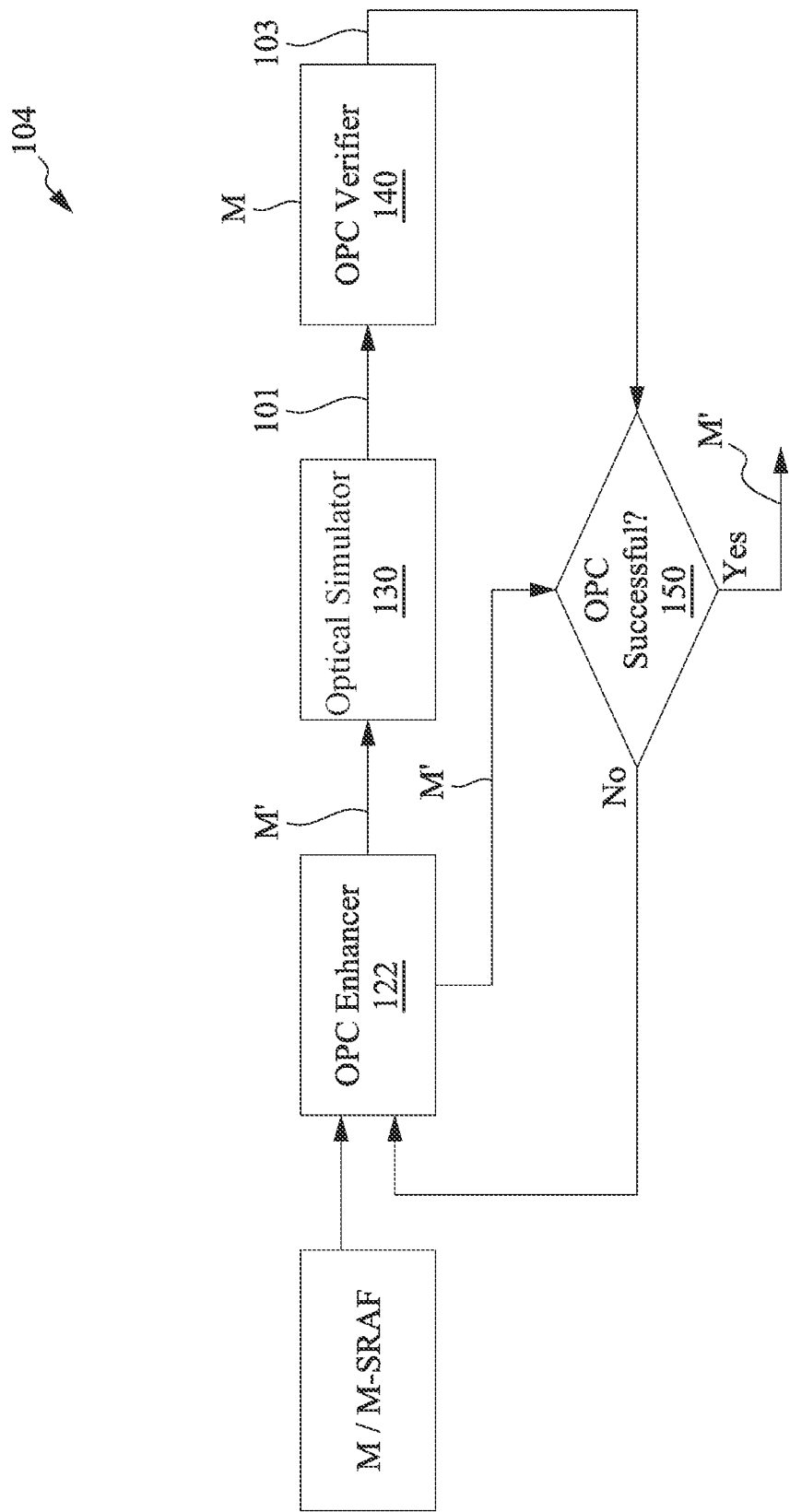
FIG. 1B illustrates a schematic diagram of an exemplary photo mask enhancer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In some embodiments, the imaging system of a lithographic system has a circular aperture, and, thus the point spread function (PSF) of the imaging system of the lithographic system has circular symmetry. As the result of the PSF of the imaging system of the lithographic system being circularly symmetric, the edges of the layout pattern of the photo mask when produced as a pattern, e.g., a resist pattern, on the wafer may include some extra rounding compared to the layout pattern of the photo mask. In some embodiments, the layout pattern of an opening, e.g., a small 2D hole, is represented as a square, however, the resist pattern produced on the wafer becomes a circle. Adding edge-based OPC enhancements to the square shape of the opening on the photo mask may not sufficiently change the outcome. The layout pattern produced on the wafer using the square opening with the edge-based OPC enhancements may still produce a circular shape resist pattern, e.g., a disk shape, on the resist layer of the wafer. Therefore, it is desirable to define the target layout pattern of the openings, e.g., small 2D holes, as circles and define the target layout patterns of the corners and end of connection lines, e.g., 1.5 D corners, as partial circles. Thus, by defining the openings, corners, and end of connection lines as circles or partial circles, the OPC may be performed to disk shapes and partial disk shapes of the target layout patterns. The OPCed disk shapes and partial disk shapes are produced as the photo mask and the photo mask is produced as circles and partial circles on the wafer. In some embodiments, the disk shapes and partial disk shapes of the target layout patterns are approximated by polygons and a vertex-based OPC is performed to the target layout patterns by moving the vertices of the polygons as described below. In some embodiments, the opening is a hole, a trench, or a L-shaped/U-shaped recess.

FIG. 1A illustrates a schematic diagram of an exemplary integrated circuit (IC) fabrication flow 100. The IC fabrication flow 100 begins with an IC design module 102 that provides layout patterns M, e.g., target layout patterns, that will be produced as resist pattern of an IC product on the wafer. The IC design module 102 generates various layout shapes, e.g., geometrical patterns, based on the specification of the IC product for different steps of processing the IC product. In some embodiments, the layout pattern M are presented by one or more data files having the information of the geometrical patterns. In some embodiments, optically projecting the layout pattern of the photo mask to the wafer in the lithographic process degrades the layout pattern of the photo mask and generates pattern defects on the resist layer on the wafer. An optical proximity correction (OPC) operation may be applied to layout patterns of the photo mask to reduce the pattern defects on the wafer. The OPC may modify the layout patterns of the photo mask before the lithography process to compensate for the effect of the lithography and/or etching process. The IC fabrication flow 100 also shows a mask enhancer 104. As will be described in more detail below with respect to FIG. 1B, the mask enhancer 104 performs the OPC in some embodiments. The mask enhancer 104 creates an OPCed (e.g., a corrected or enhanced) layout pattern M' on the photo mask. In some embodiments, the enhanced layout pattern M' is presented by one or more data files having the information of the enhanced geometrical patterns.

The IC fabrication flow 100 further shows a mask projection system 106. In some embodiments, the mask projection system 106 produces the enhanced layout patterns M' on the photo mask. In some embodiments, the mask projection system 106 performs two functions. As a first function, the mask projection system 106 uses the data files of the enhanced layout pattern M' and uses an electron beam to generate the enhanced layout pattern M' on a mask blank (not shown) to produce the photo mask for the ICs. In addition and as a second function, the mask projection system 106 optically projects the enhanced layout pattern M' of the photo mask on the wafer 108 to produce the IC layouts on the wafer 108.

FIG. 1B illustrates a schematic diagram of the mask enhancer 104. The mask enhancer 104 performs an iterative process. In some embodiments, the mask enhancer 104 includes an OPC enhancer 122 that receives, from the IC design module 102, the target layout pattern M that will be produced on the wafer 108. In some embodiments, the OPC enhancer 122 receives the modified target layout pattern with sub-resolution assist features. The sub-resolution assist features (SRAF) are defined below with respect to FIGS. 8A and 9A. Thus, in some embodiments, the modified target layout pattern with sub-resolution assist features (M-SRAF) is the input to the OPC enhancer 122. The OPC enhancer 122 performs enhancements on the target layout pattern M and produces the OPCed (e.g., the corrected or enhanced) layout pattern M'. As described, the OPC is a lithography technique that is used to correct or enhance the layout pattern M and to add improved imaging effects to target layout pattern M such that the OPCed layout pattern M' reproduces, on the wafer 108, the target layout pattern M. For example, the OPC can be used to compensate for imaging distortions due to optical diffraction. In some embodiments, the target layout pattern M is a data file having the information of the geometrical patterns to be produced on the wafer 108, and the OPC enhancer 122 modifies the data file and produces a corrected data file representing the enhanced layout pattern M'. In some embodiments, the target layout pattern M and the enhanced layout pattern M' are represented by the vertices of the layout patterns in the data files. Thus, in some embodiments, the rounded corners and the bends are represented by a curvilinear shape having multiple vertices and multiple line segments connecting the vertices and the curvilinear shape is represented by the multiple vertices in the data file.

FIG. 1B further shows an optical simulator 130, e.g., a simulator for mask projection, that is applied to the enhanced layout pattern M' to produce a projected resist pattern 101 on the wafer. In some embodiments, the enhanced layout pattern M' is a data file and the optical simulator 130 simulates the projection of the enhanced layout pattern M' on the wafer and produces the simulated projected resist pattern 101. The projected resist pattern 101 is inspected by an OPC verifier 140 for errors. In some embodiments, the OPC verifier 140 receives the target layout pattern M in addition to the projected resist pattern 101 and compares the projected resist pattern 101 with the target layout pattern M to find errors between target layout pattern M and the projected resist pattern 101. In some embodiments, the OPC verifier 140 verifies the enhanced, e.g., OPCed, layout pattern M' when the error between the target layout pattern M and the projected resist pattern 101 is below a threshold level. In some embodiments, after verifying the enhanced layout pattern M', the OPC verifier 140 generates and sends a verification signal 103. In some embodiments the OPC verifier 140 stores the enhanced layout pattern M' in a database. In some embodiments, instead of a simulated result, a photo resist pattern is formed by using a photo mask fabricated with the enhanced layout pattern M' and the shapes and dimensions of the resist patterns are measured and feedback to the OPC enhancer.

The verification signal 103 is tested at step 150 and if the verification signal 103 is not successful, e.g., the error is above the threshold level, the iterations continue by applying further OPC enhancements by the OPC enhancer 122. The iterations continue until the verification signal 103 is successful. When the verification signal 103 is successful, the enhanced layout pattern M' is provided as the output of the mask enhancer 104. In some embodiments, the error between the target layout pattern M and the projected resist pattern 101 is defined as a distance between the boundary of the target layout pattern M and a boundary of the projected resist pattern 101. In some embodiments, the M-SRAF is the input to the OPC enhancer 122 and at step 150, the error between target layout pattern M and the projected resist pattern 101 that is generated by the M-SRAF is compared with the threshold level.

FIGS. 2A and 2B show cross-sectional views of a point spread function (PSF) of an imaging system of a photo lithographic system. FIG. 2A shows a cross-section 200 of the PSF of a lithographic system, e.g., the PSF of the mask projection system 106 of a lithographic system having a circular aperture. In some embodiments, the PSF of the mask projection system 106 is a two-dimensional (2D) circularly symmetric function, e.g., an Airy disc when the illumination is circularly symmetric, e.g., when the illuminated exit pupil function of the imaging system is circularly symmetric. The cross-section 200 is produced by slicing perpendicular to the height of the PSF. FIG. 2B shows a cross-section curve 225 along a radius (R) 220 of the PSF of the lithographic system. As shown, the curve 225 and the cross-section 200 have a positive central region 202 that has a highest positive value, a negative region 204 next to the central region 202, a positive region 206 next to region 204, a negative region 208 next to the region 206, a positive region 210 next to region 208, and a negative region 212 next to region 210. The PSF has a maximum height 230 and the distance 232 between the points C and D are at one half the maximum height 230. Thus, the distance 232 is a full width at half maximum (FWHM) of the PSF along the radius 220. As shown the PSF is circularly symmetric, thereby causing a rounding of the enhanced layout pattern M'. In some embodiments, the FIGS. 2A and 2B are respectively horizontal and vertical cross sections of the Airy disc. In some embodiments, a width between points A and B of the central region 202 is between about 25 percent to about 50 percent of the critical dimension (CD). In some embodiments, when the illumination light source for mask projection is not coherent, e.g., when the illumination light source is partially coherent an intensity point spread function (PSF) is used. The intensity PSF is determined by a process 1300 described below with respect to FIG. 13.

FIGS. 3A, 3B, 3C, and 3D illustrate OPC enhanced layout patterns and the resist patterns produced on a wafer, e.g., a substrate. FIGS. 3A and 3B respectively show the target layout patterns 304 and the OPC enhanced, e.g., corrected, layout patterns 302 of an opening and a connection line. In some embodiments, the OPC enhanced layout patterns 302 of FIGS. 3A and 3B are formed on a photo mask and the photo mask is projected onto a wafer, e.g., the wafer 108, by the mask projection system 106 of FIG. 1A. FIGS. 3C and 3D respectively show the target layout patterns 304, the OPC enhanced layout patterns 302, and the projected resist patterns 306 on the wafer 108. As shown in FIGS. 3C and 3D, the projected resist pattern 306 includes additional curvatures, e.g., curvature 308 and curvature 310, such that sharp edges of the OPC enhanced layout patterns 302 have produced circular forms in the resist patterns 306. As shown in FIGS. 3B and 3D, the connection line is produced with semi-circles at the two ends and as shown in FIGS. 3A and 3C the square opening is produced as a circle. In some embodiments, the OPC enhanced layout pattern 302 of FIGS. 3A and 3B are produced by edge-based OPC such that the edges (line segments) of the target layout patterns 304 are expanded (and possibly contracted) perpendicular to the edges with different extension values at different locations. As shown in FIG. 3C, a point 312 on the OPC enhanced layout pattern 302 is moved to a point 314 on the projected resist patterns 306 and the sharp edges around the point 312 have become a curvature around the point 314 in the projected resist patterns 306.

As described, FIG. 3A shows a target layout pattern 304 of an opening, e.g., small 2D hole, and an OPC enhanced layout pattern 302. The edge-based OPC is applied to the target layout patterns 304 and the corners of the target layout patterns 304 are extended to create the OPC enhanced layout pattern 302. As shown in FIG. 3C, a projected resist pattern 306 is created on the wafer, e.g., the wafer 108. For example, the point 312 is moved to point 314 by the lithographic system, e.g. the mask projection system 106. Thus, although the target layout pattern is the layout pattern 304, e.g., a square, the projected resist pattern 306 is a circle despite adding edge-based OPC enhancements. Thus, the circular PSF of FIG. 2A causes rounding of the corners in the projected resist pattern 306.

Figure 4A:
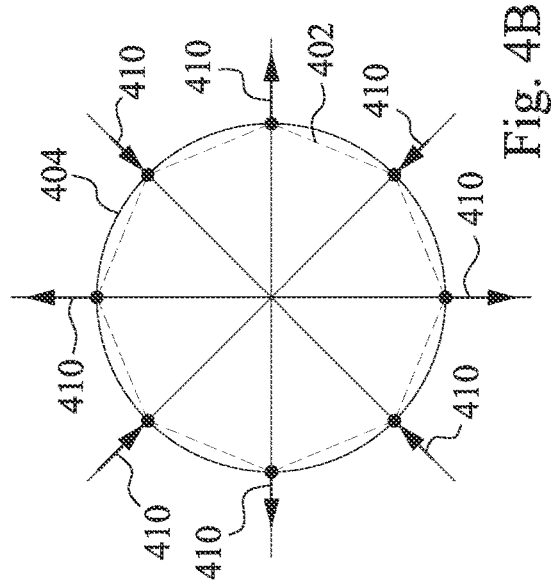
FIGS. 4A, 4B, 4C, 4D, 4E, 4F, 4G, and 4H illustrate layout patterns of openings and the OPC enhanced layout patterns of the openings in accordance with some embodiments of the present disclosure.
Figure 4B:
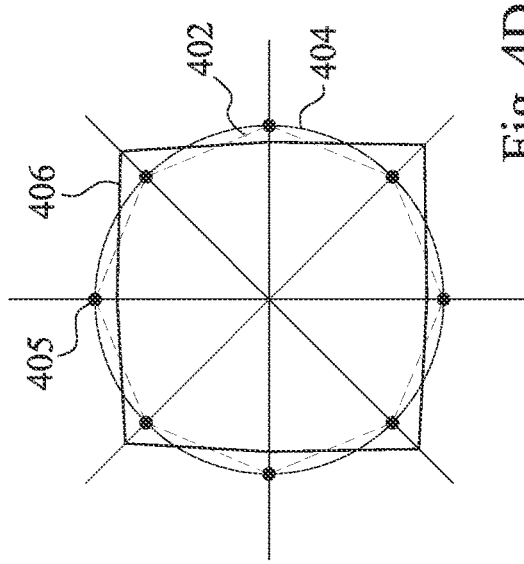
Figure 4C:
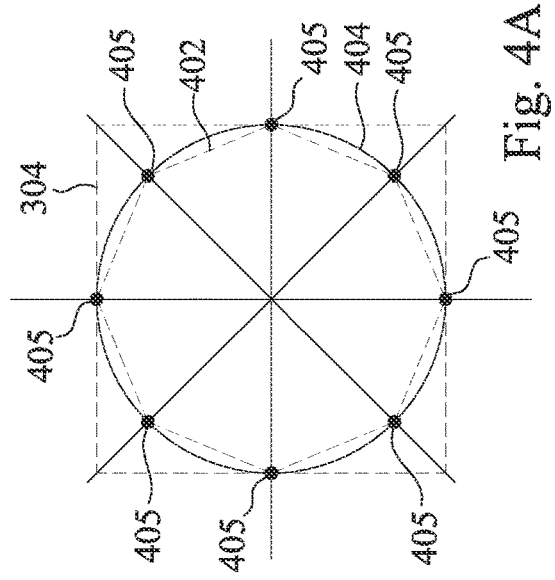

FIGS. 4A, 4B, 4C, 4D, 4E, 4F, 4G, and 4H illustrate layout patterns of openings and the OPC enhanced layout patterns of the openings in accordance with some embodiments of the present disclosure. FIG. 4A shows an original target layout pattern, a square target layout pattern 304 of an opening. The original target layout pattern 304 is modified, e.g., adjusted, and the modified target layout pattern 404 is generated that does not have sharp edges and thus is more fitted to the circular PSF of the photo lithographic system shown in FIGS. 2A and 2B. The target layout pattern 404 is approximated by a regular polygon 402 having a number of the vertices 405. The number of the vertices 405 is more than 4 vertices, e.g., between 5 and 32 vertices. As shown in FIG. 4B, in an OPC operation, a location of one or more of the vertices is modified, e.g., moved, along a diagonal direction as shown by diagonal arrows 410 and a vertex-based OPC enhanced layout pattern 406 is generated. A magnitude and direction of the diagonal arrow 410 shows an amount and the direction that a vertex 405 is moved. When the diagonal arrow 410 points toward the center of the polygon 402 that is the center of the circle of the target layout pattern 404, the associated vertex 405 is moved inward. When the diagonal arrow 410 points away from the center of the polygon 402, the associated vertex 405 is moved outward. FIG. 4C shows a vertex-based OPC enhanced layout pattern 406 based on a representation of the target layout pattern 404 of the opening by the regular polygon 402. In some examples, when the OPC enhanced layout pattern 406 is projected onto the wafer 108 the target layout pattern 404 is produced on the wafer 108.

Figure 4D:
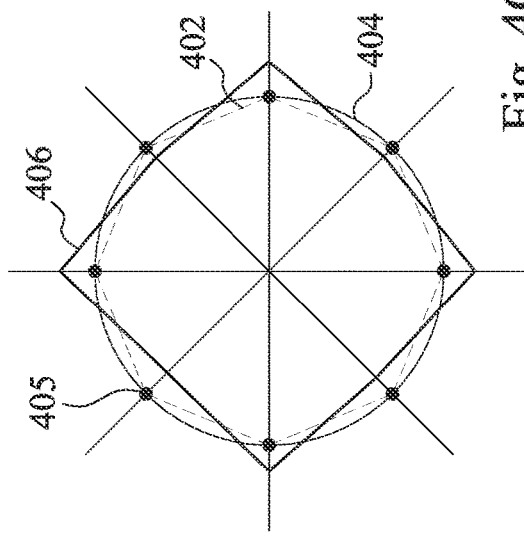

FIG. 4D shows another vertex-based OPC enhanced layout pattern 406 based on the representation of the target layout pattern 404 of the opening by the regular polygon 402. As shown in FIGS. 4C and 4D, the vertices are moved inward and outward alternatively by different amounts. In some embodiments, the vertices are moved inward and outward alternatively by the same first amount for the inward movement and the same second amount for the outward movement. In some embodiments, the first and second amount are the same. In some embodiments, at least one of the vertices is moved inward and at least one of the vertices is moved outward.

Figure 4F:
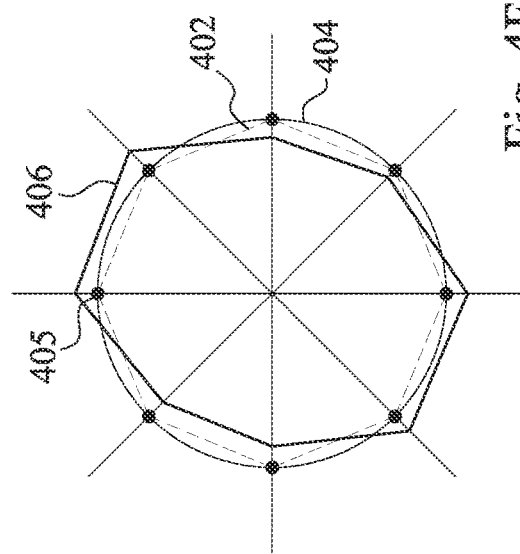
Figure 4H:
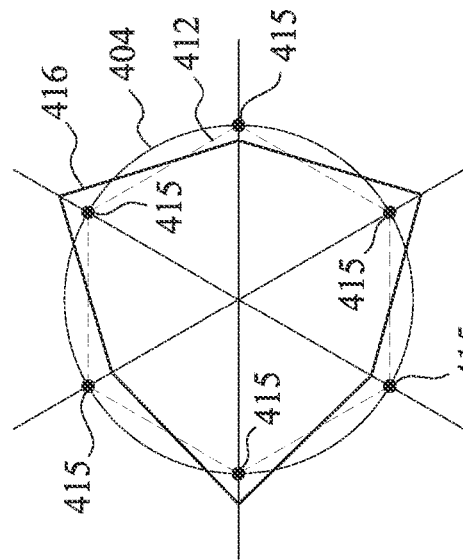
Figure 4E:
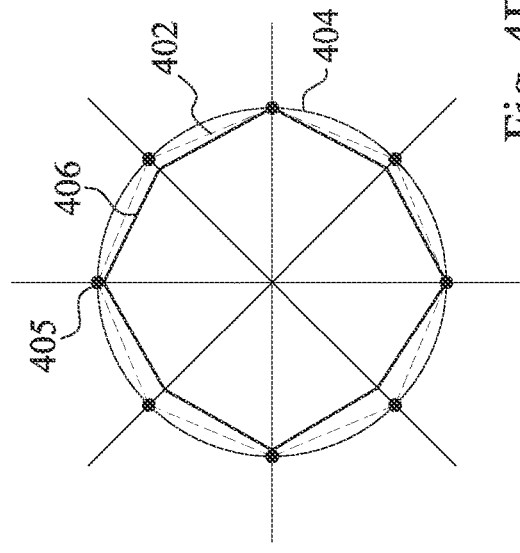
Figure 4G:
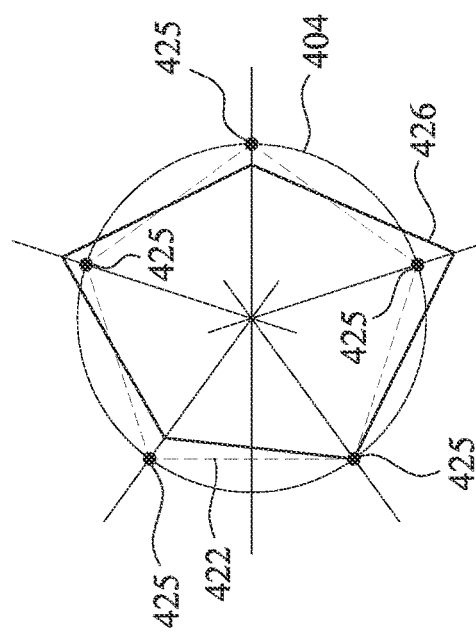

FIG. 4E shows another vertex-based OPC enhanced layout pattern 406 based on the representation of the target layout pattern 404 of the opening by the regular polygon 402. As shown in FIG. 4E, the vertices are moved inward by different amounts and at least one of the vertices is not moved. FIG. 4F shows another vertex-based OPC enhanced layout pattern 406 based on the representation of the target layout pattern 404 of the opening by the regular polygon 402 that every two vertices are alternatively moved inward and outward by different amounts. FIG. 4G shows another vertex-based OPC enhanced layout pattern 426 based on the representation of the target layout pattern 404 of the opening by a regular five-sided polygon 422, e.g., a pentagon. As shown in FIG. 4G, the five vertices 425 are moved inward or outward by either different amounts or the same amount and one vertex is not moved. FIG. 4H shows another vertex-based OPC enhanced layout pattern 416 based on the representation of the target layout pattern 404 of the opening by a regular six-sided polygon 412, e.g., a hexagon. As shown in FIG. 4H, the six vertices 415 are alternatively moved inward and outward by either different amounts or the same amount. Thus, as described, in vertex-based OPC the vertices of the polygon 402 are moved but no new vertices are added.

FIGS. 5A and 5B illustrate layout patterns 404 of adjacent openings and the OPC enhanced layout patterns 406 of the adjacent openings in accordance with some embodiments of the present disclosure. As shown in FIG. 5A, the vertices X and Y on the two target layout patterns 404 of the two openings are at the vicinity of each other. In some embodiments, the two vertices X and Y are moved inward such that the vertex-based OPC enhanced layout pattern 406 of the two openings at a location 510 of FIG. 5B are further apart from each other compared to the target layout pattern 404 at the location 510 of FIG. 5A and, thus, the probability of connecting the two openings after projection to the wafer 108 is reduced.

Figure 6A:
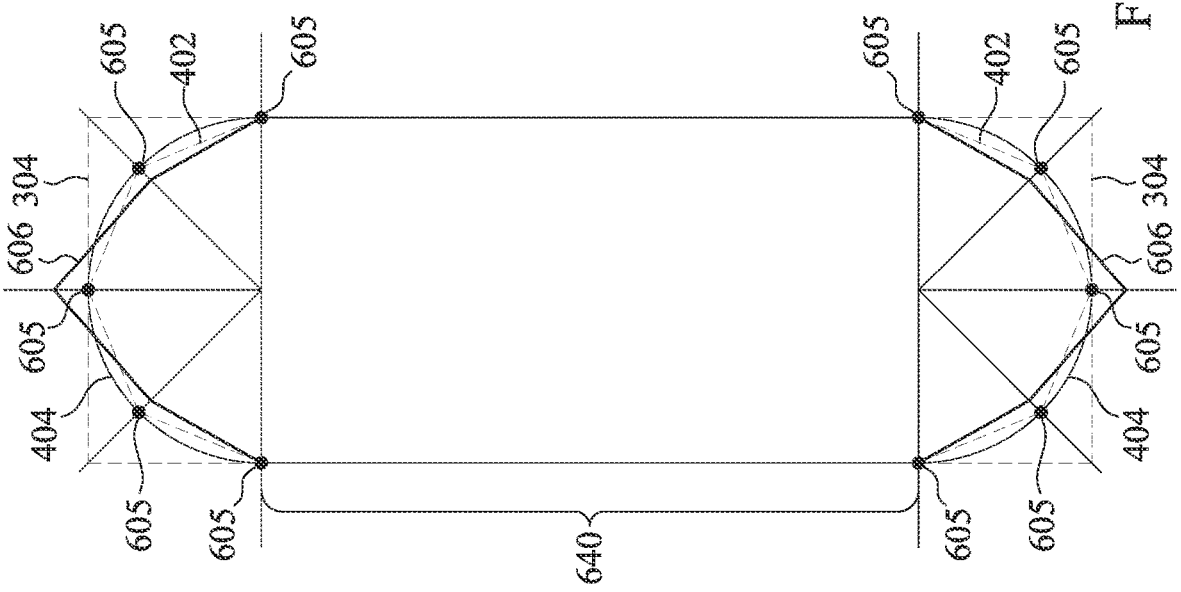
FIGS. 6A, 6B, 6C, 6D, and 6E illustrate layout patterns of connection lines and a polygon and the OPC enhanced layout patterns of the connection lines and the polygon in accordance with some embodiments of the present disclosure.
Figure 6B:

FIGS. 6A, 6B, 6C, 6D, and 6E illustrate layout patterns of connection lines and a polygon and the OPC enhanced layout patterns of the connection lines and the polygon in accordance with some embodiments of the present disclosure. FIG. 6A shows a target layout pattern 304 of a connection line having two semi-squares at the two ends. In some embodiments, the target layout patterns of the two ends of the connection line is modified to a target layout pattern 404, which is a semi-circle. Similar to the discussion for the openings, the semi-circles at the two ends of the connection line are represented by regular semi-polygons 402 having vertices 605. FIG. 6B shows a vertex-based OPC enhanced layout pattern 606 for FIG. 6A based on a representation of the target layout pattern 404 of the semi-circles by the regular semi-polygon 402. In some embodiments, edge-based OPC enhancements similar to the edge-based OPC enhancements of FIGS. 3B and 3D are added to a section 640 of the connection line of FIGS. 6A and 6B. In some embodiments and in the vertex-based OPC enhanced layout pattern 606, at least two vertices are moved inward and outward alternatively by either the same amount or by different amounts.

Figure 6D:
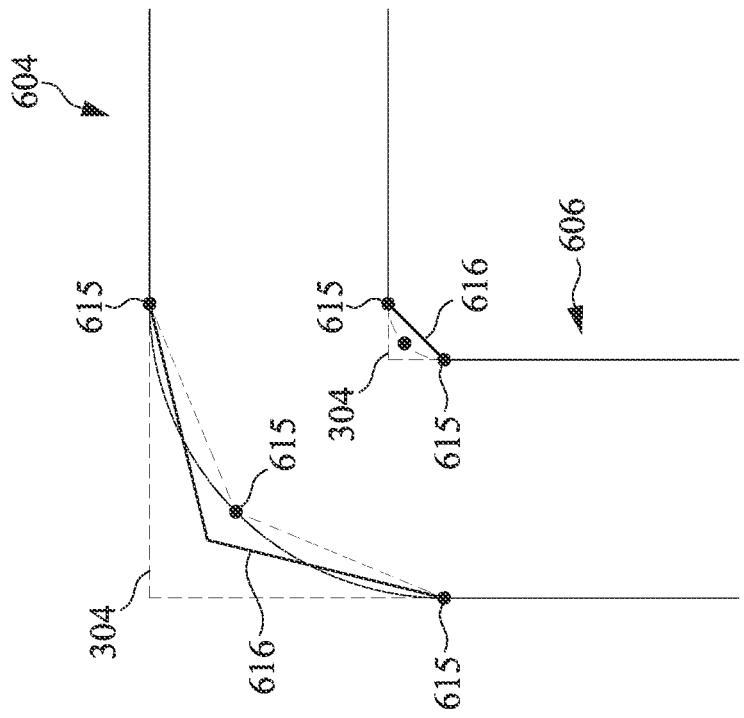
Figure 6C:
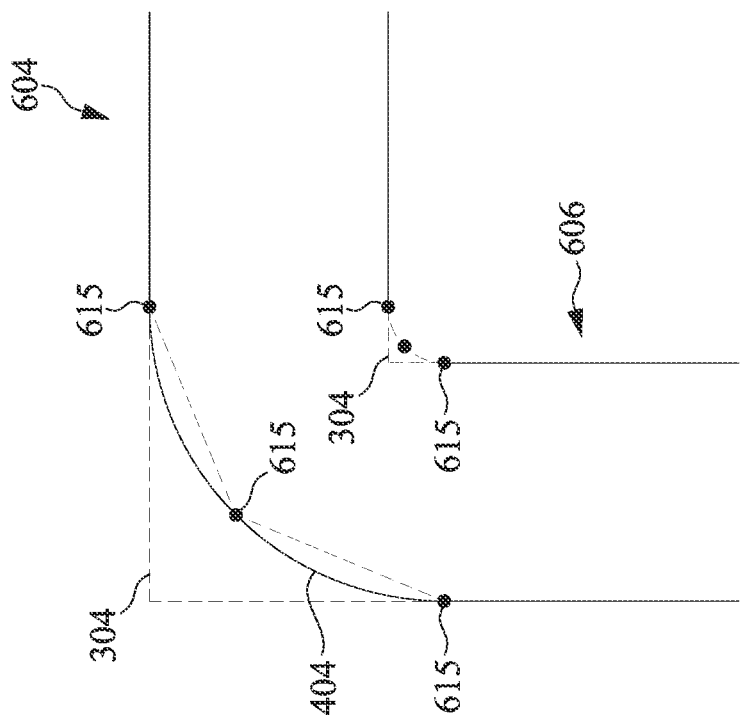

FIG. 6C shows a target layout pattern 304 of a connection line having a bending. In some embodiments, the target layout patterns of the bending of the connection line is modified to a target layout pattern 404, which has one or more arcs. Similar to the discussion for the openings, the modified target layout patterns 404 (the arcs) at the bending of the connection line are represented by regular partial-polygons 402 having vertices 615. FIG. 6D shows a vertex-based OPC enhanced layout pattern 616 for FIG. 6C and based on a representation of the target layout pattern 404 of the semi-circles by the regular semi-polygon 402. In some embodiments, edge-based OPC enhancements similar to the edge-based OPC enhancements of FIGS. 3B and 3D is added to a sections 604 and 606 of the connection line of FIGS. 6C and 6D. In some embodiments and in the vertex-based OPC enhanced layout pattern 616, at least two vertices are moved inward and outward alternatively by either the same amount or by different amounts.

In some embodiments, the OPC enhancer 122 of FIG. 1B applies the vertex-based OPC enhancement to the target layout pattern, e.g., the target layout pattern 404 of FIG. 6A and moves the vertices 605 of the semi-polygons that represents the target layout pattern 404 and generates the vertex-based OPC enhanced layout pattern 606 of FIG. 6B. As discussed above, the optical simulator 130 generates the projected resist pattern 101 on a resist layer of the wafer 108 from the vertex-based OPC enhanced layout pattern 606 and the OPC verifier 140 compares the projected resist pattern 101 with the target layout pattern 404 to find an error between target layout pattern 404 and the projected resist pattern 101. In some embodiments, the OPC verifier 140 verifies the corrected, e.g., OPCed, e.g., OPC enhanced, layout pattern 606 when the error between target layout pattern 404 and the projected resist pattern 101 is below the threshold level. As discussed with respect to FIG. 1B, the vertex-based OPC enhancement may iteratively continue and different patterns of vertex-based OPC may be applied to the semi-polygons 402 by moving the vertices 605 inward or outward by different amounts until the error between target layout pattern 404 and the projected resist pattern 101 is below the threshold level. In some embodiments, the amount of the vertex movement of the vertex-based OPC enhancement in a next iteration is determined based on the error of a current iteration. In some embodiments, one of the vertices is moved in each iteration until the error does not decrease and then another vertex is moved. In some embodiments, two or more vertices are moved at the same time until the error reached within threshold value.

Figure 6E:
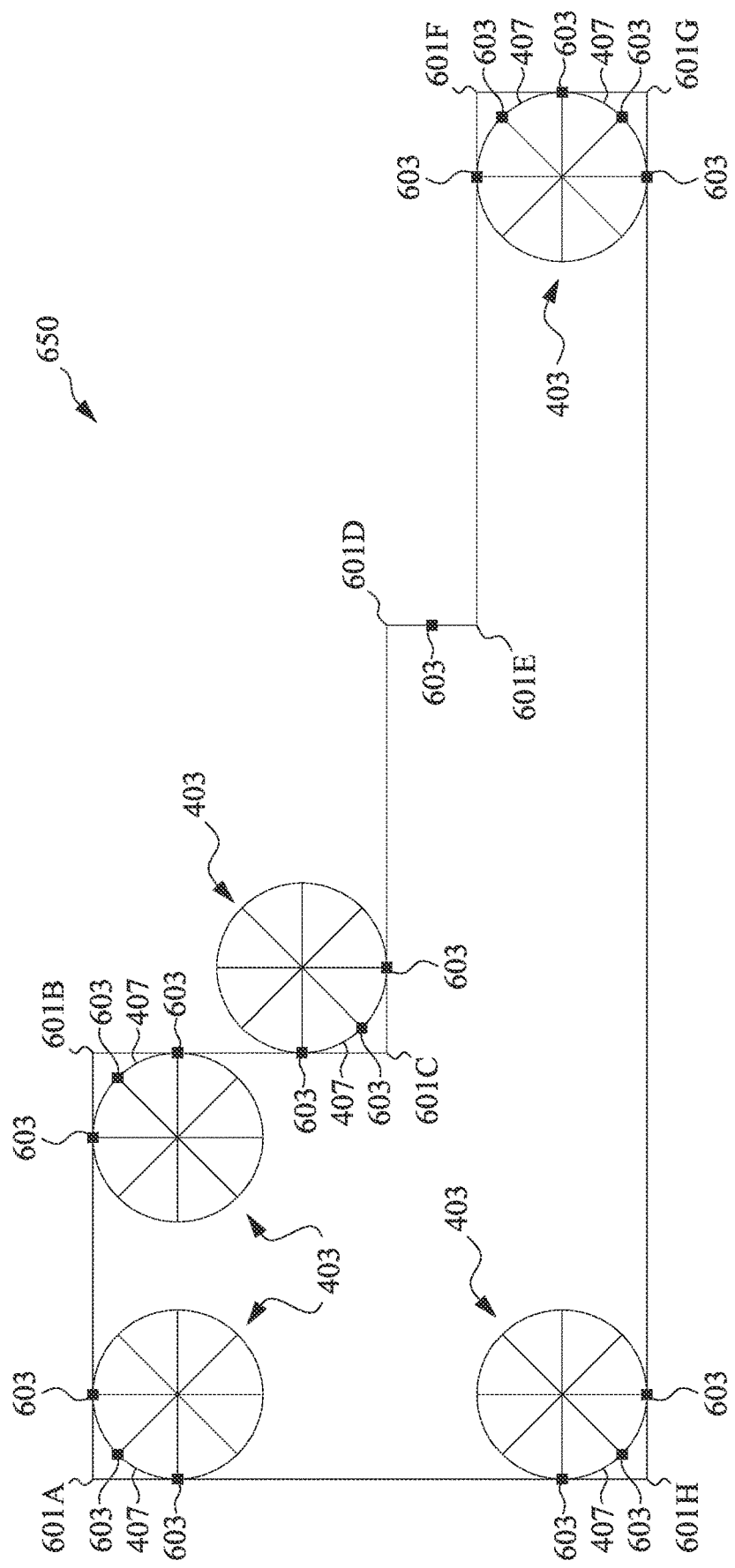
Figure 11:
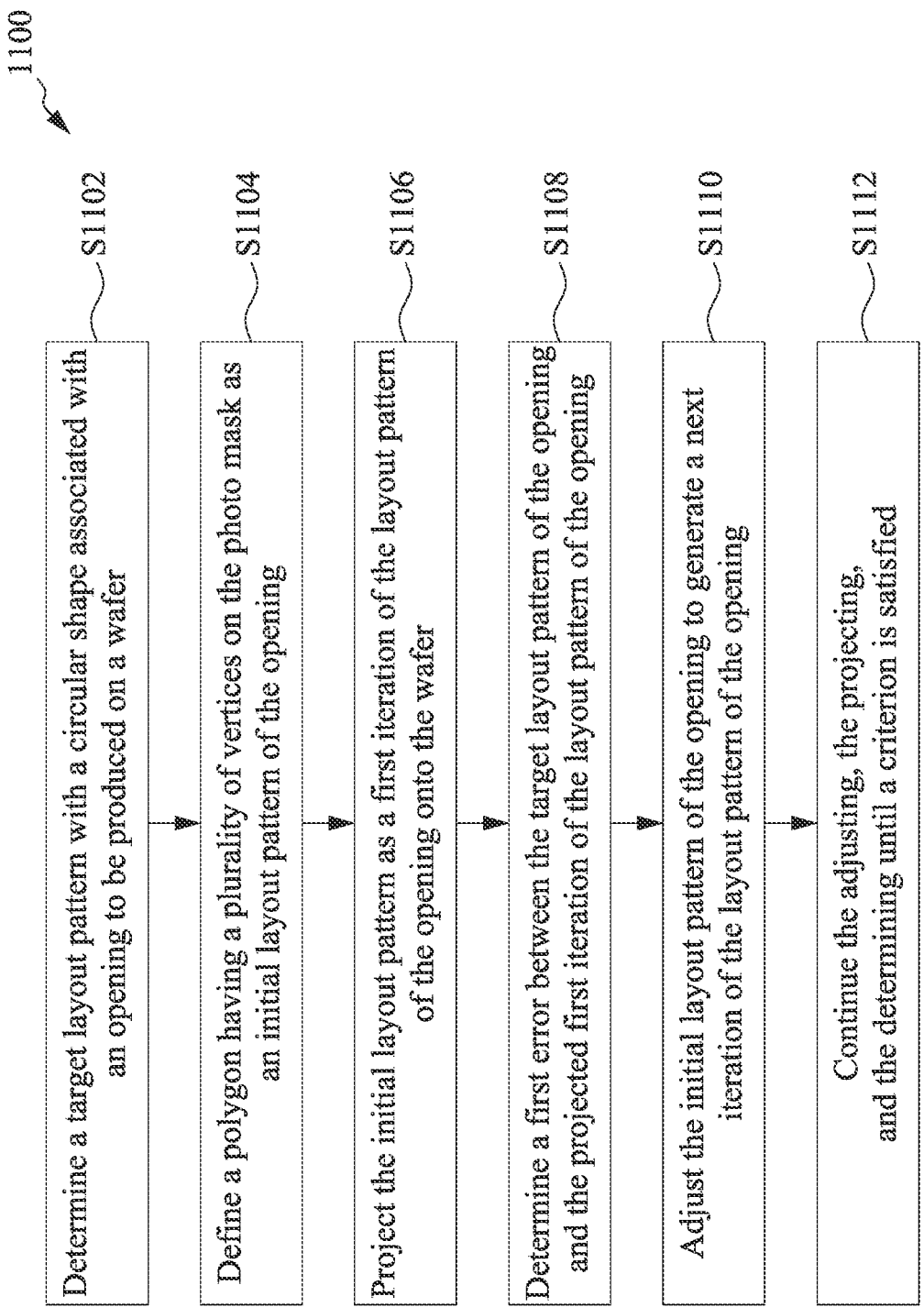
FIG. 11 illustrates a flow diagram of an exemplary process for enhancing a photo mask in accordance with some embodiments of the disclosure.

FIG. 6E shows a target layout pattern of a polygon 650 having sharp vertices 601A, 601B, 601C, 601D, 601E, 601F, 601G, and 601H. In some embodiments, the target layout patterns of the polygon 650 is modified to an enhanced target layout pattern, which has round corners with a curvature 407, where the curvature 407 is a portion of a circle 403 having the diameter of FWHM. In some embodiments, the diameter of the circle is FWHM of the PSF and the PSF is an intensity PSF as defined by the process 1300 described below with respect to FIG. 13. Similar to the discussion above, the curvature at the vertices 601A, 601B, 601C, 601D, 601E, 601F, 601G, and 601H is represented by regular partial polygons having vertices 603. In some embodiments, the target layout patterns of the polygon 650 are modified to the enhanced target layout pattern according to a process 1400 described below with respect to FIG. 14. In some embodiments, the enhanced target layout pattern is adjusted according to a process 1100 described below with respect to FIG. 11 such that a criterion described with respect to FIG. 11 is satisfied. In some embodiments, the adjustment is iteratively performed until a percentage error between the projected resist pattern and the enhanced target layout pattern is in a threshold range of between 1 percent and 5 percent. In some embodiments, the adjustment includes moving the vertices 603 along a radius of the circles 403 toward a center of the circle 403 or away from the center of the circle 403. In some embodiments, the edges of the enhanced target layout pattern in the regions away from the corners are modified according to FIGS. 3A and 3B.

Figure 7A:
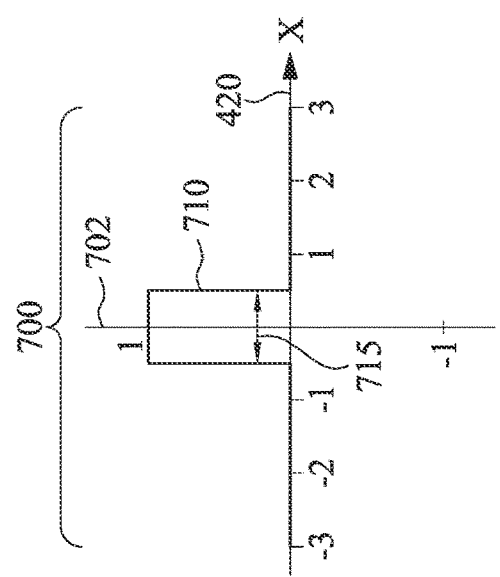
FIGS. 7A, 7B, and 7C illustrate a layout pattern of a photo mask, an amplitude of the light when the layout pattern is imaged on a resist layer on a wafer, and an intensity of the light when the layout pattern is imaged on the resist layer on the wafer.
Figure 7B:
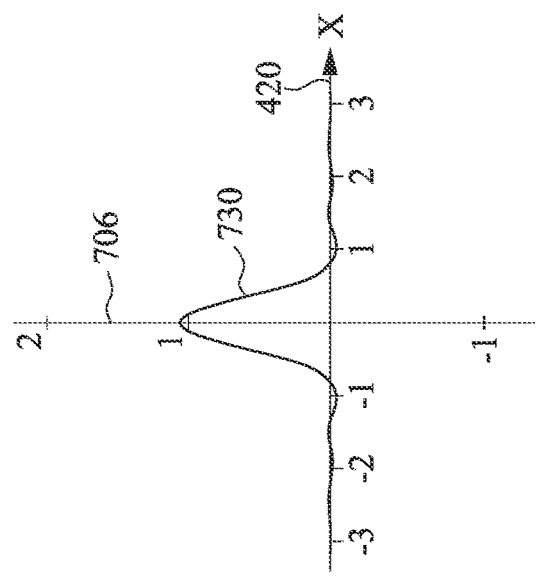
Figure 7C:
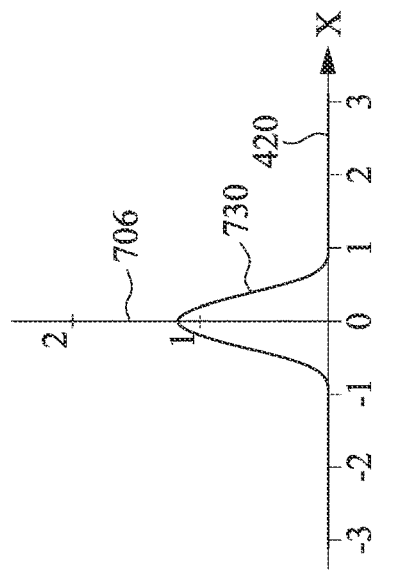

FIGS. 7A, 7B, and 7C illustrate a layout pattern 710 of a photo mask, an amplitude of the light when the layout pattern 710 is imaged on a resist layer on a wafer, and an intensity of the light when the layout pattern 710 is imaged on the photo resist layer of the wafer 108. A graph 700 of FIG. 7A shows a one-dimensional (1D) layout pattern 710, e.g., a cross-sectional view of a rectangular feature, of a photo mask on amplitude coordinate 702 and on distance (X) coordinate 420. In some embodiments, the PSF of the 1D imaging system is the Fourier transform of a rectangle function. The Fourier transform of the rectangle function has a main lobe and also has side lobes. The zeros of the PSF that are the zeros of the main lobe and the side lobes, are located at $X=m*0.5*\lambda/NA$, where $m= \ldots, -3, -2, -1, 1, 2, 3, \ldots$, NA is the numerical aperture of the imaging system, and $\lambda$ is the wavelength of the imaging system. A unit of the distance coordinate 420 is $\lambda/NA$ that is the width of the main lobe of the PSF of the 1D imaging system in some embodiments. Thus, the width 715 of the layout pattern 710 is $\lambda/NA$ or the width of the main lobe of the PSF. In some embodiments, for a circularly symmetric PSF as shown in FIGS. 2A and 2B, the zeros are at radius $0.61*\lambda/NA$, $1.12*\lambda/NA$, $1.62*\lambda/NA$, $2.12*\lambda/NA$, $2.62*\lambda/NA$, etc.

In some embodiments, the layout pattern 710 of a mask where the amplitude is one is imaged as a bright zone on the wafer and outside the layout pattern 710 where the amplitude is zero is imaged as dark zone. FIGS. 7B and 7C show the amplitude 720 on the amplitude coordinate 704 and the intensity 730 (amplitude squared) on the intensity coordinate 706 of the imaged layout pattern 710 of the photo mask produced by a photo lithographic system on the resist layer of the wafer 108. In some embodiments, the PSF of the 1D imaging system is the Fourier transform of a rectangle function and, thus, the amplitude 720 of the projected light of the layout pattern 710 is the result of the 1D convolution of the PSF with the layout pattern 710. In some embodiments, the width 715 of layout pattern 710 is comparable with the FWHM of the PSF as defined with respect to FIG. 2B.

FIGS. 8A, 8B, and 8C illustrate an enhanced layout pattern 810 of a photo mask that includes sub-resolution assist features 815, an amplitude of the light when the enhanced layout pattern 810 is imaged on a resist layer on the wafer 108, and an intensity of the light when the enhanced layout pattern 810 is imaged on the resist layer on the wafer 108 in accordance with some embodiments of the disclosure. FIG. 8A shows a 1D layout pattern 810 of a photo mask on amplitude coordinate 802 and on distance (X) coordinates 420. FIGS. 8B and 8C show light amplitude 820 on amplitude coordinate 804 and light intensity 830 (amplitude squared) on intensity coordinate 806 of the imaged (using 1D imaging) layout pattern 810 and produced by a photo lithographic system on the wafer 108. In some embodiments, the lithographic system has the PSF discussed with respect to FIGS. 7A, 7B, and 7C. In addition to the layout pattern 710 of FIG. 7A, the layout pattern 810 includes sub-resolution assist features 815. As discussed, the width 715 of the layout pattern 710 is $\lambda/NA$. In some embodiments, the width of the sub-resolution assist features 815 is half of the width 715 or $0.5*\lambda/NA$. Thus, in some embodiments, the projected light amplitude 820 and light intensity 830 have higher amplitude and intensity at the origin compared to the projected light amplitude 720 and light intensity 730 at the origin. In some embodiments, although the sub-resolution assist features 815 cause the higher amplitude and intensity at the origin of the projected light amplitude 820 and light intensity 830, also cause more ringing outside a main section 805 of the light amplitude 820 and light intensity 830 compared to the ringing of the projected light amplitude 720 and light intensity 730. In some embodiments, ringing outside the main section 805 has a lower intensity such that the intensity of the ringing outside the main section 805 does not fully expose the photoresist material, e.g., a positive-tone photoresist material and the photoresist material remain at the locations outside the main section 805. As shown in FIG. 8C, the intensity of the main section 805 is at least twice the intensity of the ringing outside the main section 805, and, thus, the intensity at the main section 805 fully exposes the photoresist material. In some embodiments, the sub-resolution assist features 815 are determined by a process 1250 described below with respect to FIG. 12.

In some embodiments, the layout pattern 710 of FIG. 8A, which is also shown in FIG. 7A is the cross-sectional view of a feature such as a connection line or a connection opening in some embodiments. The layout pattern 710 is shrunk according to operation S1206 that will be discussed below with respect to FIG. 12, the sharp corners, e.g., the sharp vertices, of the shrunk layout pattern are rounded according to operation S1208 discussed below with respect to FIG. 12, and a convolution of the shrunk layout pattern with rounded corner is obtained with a PSF of the imaging system according to operation S1210 discussed below. In some embodiments, the PSF is determined according to process 1300 described below with respect to FIG. 13. In some embodiments, the PSF shown in FIG. 2B is used for the convolution. In the outcome of the convolution (not shown) the main lobe corresponds to layout pattern 710 and the side lobes are used for determining the sub-resolution assist features 815. The positive side lobes are assigned to mask state 1 and the negative side lobes are assigned to mask state 2. As will be described below with respect to FIG. 12, in a binary mask consistent with the mask with the layout pattern shown in FIG. 8A, the regions 814 that are set to mask state 1 are set to value one and the regions 816 that are set to mask state 2 are to value zero and, thus, the sub-resolution assist features 815 are determined. In some embodiments, the sub-resolution assist features 815 are included as shown in FIG. 8A next to the layout pattern 710 in the photo mask.

Figure 9C:
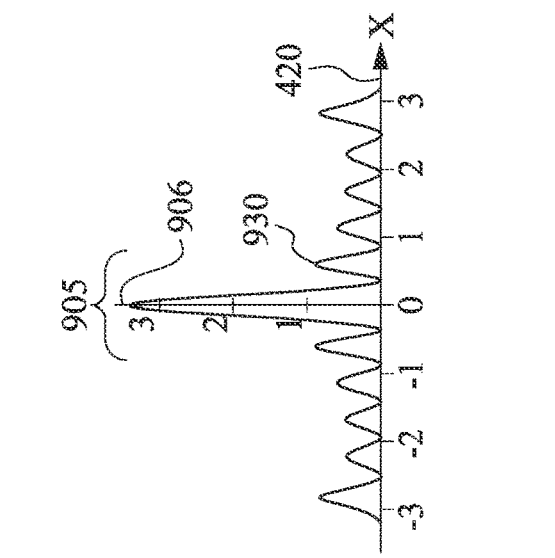
FIGS. 9A, 9B, and 9C illustrate an enhanced layout pattern of a photo mask that includes sub-resolution assist features, an amplitude of the light when the enhanced layout pattern is imaged on a resist layer on a wafer, and an intensity of the light when the enhanced layout pattern is imaged on the resist layer on the wafer in accordance with some embodiments of the disclosure.
Figure 9B:
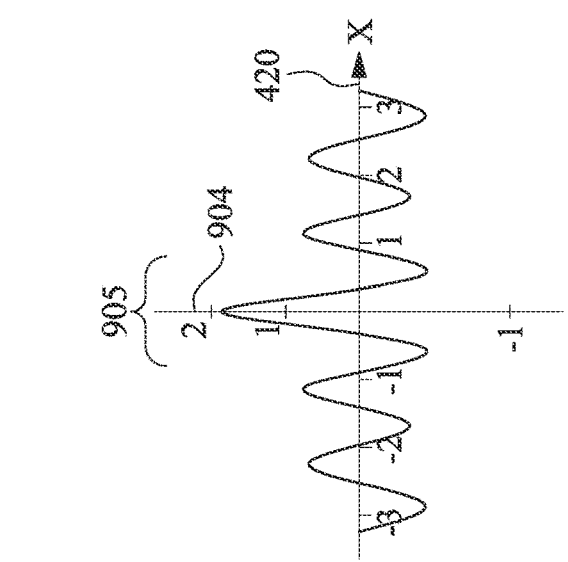
Figure 9A:
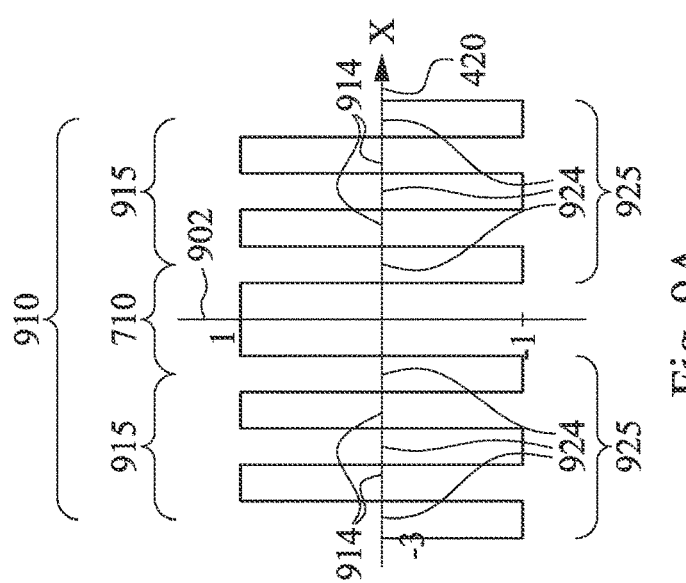

FIGS. 9A, 9B, and 9C illustrate an enhanced layout pattern 910 of a photo mask that includes sub-resolution assist features 915 and 925, an amplitude of the light when the enhanced layout pattern 910 is imaged on a resist layer on the wafer 108, and an intensity of the light when the enhanced layout pattern 910 is imaged on the resist layer on the wafer 108 in accordance with some embodiments of the disclosure. FIG. 9A shows 1D layout pattern 910 of a photo mask shown on amplitude coordinate 902 and on distance (X) coordinates 420. FIGS. 9B and 9C show light amplitude 920 on amplitude coordinate 904 and light intensity 930 (amplitude squared) on intensity coordinate 906 of the imaged (1D imaging) layout pattern 910 and produced by a lithographic system on the wafer 108. In some embodiments, the lithographic system has the PSF discussed with respect to FIGS. 7A, 7B, and 7C. In addition to the layout pattern 710 of FIG. 7A, the layout pattern 910 includes positive sub-resolution assist features 915 and negative sub-resolution assist features 925. As discussed, the width 715 of the layout pattern 710 is $\lambda/NA$. In some embodiments, the width of positive sub-resolution assist features 915 is half of the width 715 or $0.5*\lambda/NA$ and the width of negative sub-resolution assist features 925 is also half of the width 715 or $0.5*\lambda/NA$. In some embodiments, an amplitude of the sub-resolution assist features 915 and 925 is equal to the amplitude of the layout pattern 710. The negative sub-resolution assist features 925 are produced by creating a 180 degrees phase shift in a location of the negative sub-resolution assist features 925 on the photo mask. Thus, in some embodiments, the projected light amplitude 920 and light intensity 930 have higher amplitude and intensity at the origin compared to the projected light amplitude 820 and light intensity 830 at the origin. In some embodiments, the positive sub-resolution assist features 915 and the negative sub-resolution assist features 925 also cause extra ringing outside a main section 905 of the light amplitude 920 and light intensity 930 compared to the projected light amplitude 820 and light intensity 830. In some embodiments, the lithographic system is designed such that a photo resist material may not be developed by the intensity of the extra ringing. In some embodiments, using the sub-resolution assist feature 815 of FIG. 8A and the sub-resolution assist features 915 and 925 of FIG. 9A produces higher projected light amplitude and light intensity at the boundaries of the pattern when imaged on the resist layer of the wafer 108. The ringing outside the main section 905 has a lower intensity such that the intensity of the ringing outside the main section 905 does not fully expose the photoresist material, e.g., a positive-tone photoresist material and the photoresist material remain at the locations outside the main section 905. As shown in FIG. 9C, the intensity of the main section 905 is at least three times the intensity of the ringing outside the main section 905, and, thus, the intensity at the main section 905 fully exposes the photoresist material. In some embodiments, the sub-resolution assist features 915 and 925 are determined by the process 1250 described below with respect to FIG. 12.

In some embodiments, the minimum pitch is $0.5*\lambda/NA$ and a width of the sub-resolution assist features 815, 915, or 925 is between about $0.15*\lambda/NA$ to about $0.35*\lambda/NA$, e.g., $0.25*\lambda/NA$.

In some embodiments, the layout pattern 710 of FIG. 9A, which is also shown in FIG. 7A is the cross-sectional view of a feature such as a connection line or a connection opening in some embodiments. The layout pattern 710 is shrunk according to operation S1206 discussed below with respect to FIG. 12, the sharp corners of the shrunk layout pattern are rounded according to operation S1208, and a convolution of the shrunk layout pattern with rounded corner is obtained with a PSF of the imaging system according to operation S1210 discussed below. In the outcome of the convolution (not shown) the main lobe corresponds to layout pattern 710 and the side lobes are used for determining the sub-resolution assist features 915 and 925. The positive side lobes are assigned to mask state 1 and the negative side lobes are assigned to mask state 2. As will be described below with respect to FIG. 12, in a phase-shift mask consistent with the mask with the layout pattern shown in FIG. 9A, the regions 914 that are set to mask state 1 are set to value one and the regions 924 that are set to mask state 2 are to value −1 and, thus, the sub-resolution assist features 915 and 925 are determined. In some embodiments, the sub-resolution assist features 915 and 925 are included as shown in FIG. 9A next to the layout pattern 710 in the photo mask.

Figure 10:
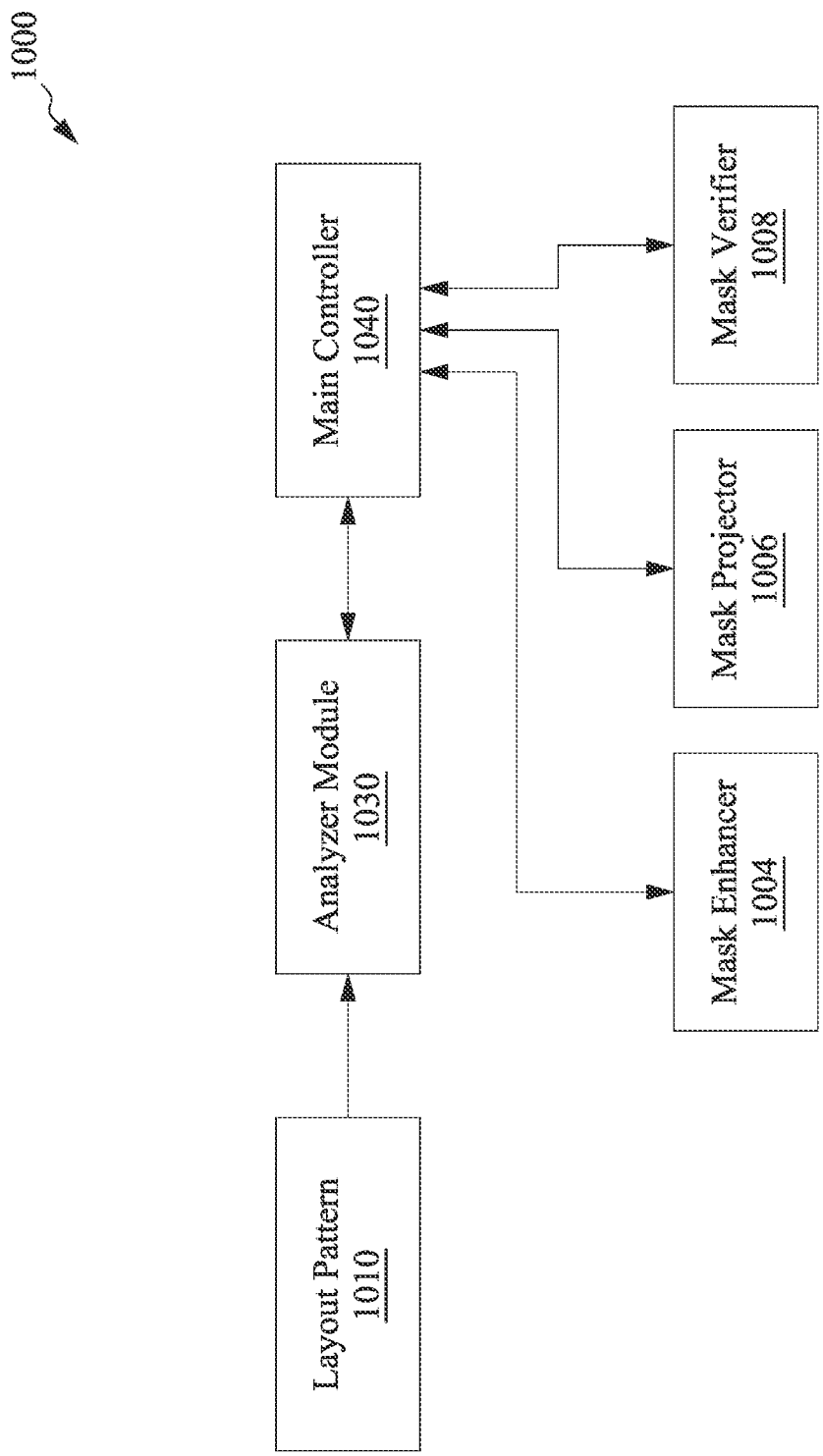
FIG. 10 illustrates an exemplary system of enhancing a photo mask in accordance with some embodiments of the disclosure.

FIG. 10 illustrates an exemplary system of enhancing a photo mask in accordance with some embodiments of the disclosure. The system 1000 includes an analyzer module 1030 and a main controller 1040 coupled to each other. The analyzer module 1030 receives the layout pattern 1010 which is consistent with the target layout pattern M of FIGS. 1A and 1B or the target layout pattern 304 of FIG. 4A. The analyzer module 1030 may parse the target layout pattern to determine one or more sub-patterns of the target layout pattern. In some embodiments, the analyzer module 1030 may parse the target layout pattern to determine one or more openings as shown in FIGS. 4A and 5A or one or more connection lines that include rectangular shapes with one or more arc shapes at one or both ends of the connection line or a bending location of the connection line as shown in FIGS. 6A and 6C.

In some embodiments, the analyzer module 1030 may parse a target layout pattern M to determine square openings, line-end shapes at the end of connection lines, and sharp bending of the connection lines. The analyzer module 1030 generates a modified target layout pattern 404 that replaces a square, a semi-square, and a sharp bending with a circle and/or an arc. In some embodiments, analyzer module 1030 generates the circular target layout pattern 404 of FIGS. 4A, 4B, 4C, 4D, 4E, 4F, 4G, and 4H for the opening; generates modified target layout pattern 404 (a semi-circle) of FIG. 6A for an end of the connection line; and generates the modified target layout pattern 404 (an arc) of FIG. 6C for sharp bending of the connection line. In some embodiments, the analyzer module 1030 approximates the circles and the arc with polygons to generate an approximation of the modified target layout pattern, e.g., generates the polygon 402 of FIGS. 4A, 4B, 4C, 4D, 6A, and 6C as approximation the modified target layout patterns 404. In some embodiments, the modified target layout pattern 404 is represented, e.g., approximated, by a curvilinear shape that include multiple vertices and the data file includes the vertices.

In some embodiments, an opening is originally represented by four corners. Considering the circularly symmetric PSF shown in FIGS. 2A and 2B, the four corners representing the target is modified such that each corner is replaced with a curvature having a radius of $0.5*FWHM*FWHM$ of the PSF shown in FIG. 2B. Thus, the opening is represented by a modified target layout pattern having four round corners, e.g., a disk shape. In some embodiments, a line-end is originally represented by two corners. The two corners representing the target is modified such that each end is replaced with a curvature having a radius of $0.5*FWHM*FWHM$ of the PSF. Thus, the line-end is represented by a modified target layout pattern having two round segments. In some embodiments, a bending is originally represented by two corners. The two corners representing the target is modified such that each corner is replaced with a curvature having a radius of $0.5*FWHM*FWHM$ of the PSF. Thus, the bending is represented by a modified target layout pattern having two round segments. In some embodiments, the corners are modified in a distance of $0.5*FWHM$ for each side of the corner. In some embodiments, and depending the illumination light being coherent or partially coherent the FWHM of the PSF is $0.61*\lambda/NA$ or $0.42*\lambda/NA$ respectively.

The system 1000 also includes a mask enhancer 1004 that is coupled to the analyzer module 1030 through the main controller 1040. In some embodiments, the mask enhancer 1004 is consistent with OPC enhancer 122 of FIG. 1B. The system 1000 includes a mask projector 1006 that is coupled to the analyzer module 1030 through the main controller 1040. In some embodiments, the mask projector 1006 is consistent with optical simulator 130 of FIG. 1B. The system 1000 further includes a mask verifier 1008 that is coupled to the analyzer module 1030 through the main controller 1040. In some embodiments, the mask verifier 1008 is consistent with OPC verifier 140 of FIG. 1B. In some embodiments, the mask enhancer 1004, the mask projector 1006, and the mask verifier 1008 are included in the main controller 1040.

FIG. 11 illustrates a flow diagram of an exemplary process for enhancing a photo mask in accordance with some embodiments of the disclosure. The process 1100 may be performed by the system of FIGS. 1B and 10. In some embodiments, the process 1100 or a portion of the process 1100 is performed and/or is controlled by the computer system 1200 described below with respect to FIGS. 15A and 15B. The method includes the operation S1102 of determining a target layout pattern with a disk shape associated with an opening to be produced on a wafer. As shown in FIG. 4A, the target layout pattern 404 of the opening will be produced on the wafer. In operation S1104, a polygon 402 having a plurality of vertices is defined on the photo mask as an initial layout pattern of the opening. In some embodiments, the polygon 402 in FIG. 4A is approximation of the circular target layout pattern 404 of the opening. In operation S1106, the initial layout pattern, the polygon 402, is projected onto the wafer as a first iteration of the resist pattern of the opening. As shown in FIGS. 1B and 10, the projection is performed by the optical simulator 130 of FIG. 1B or the mask projector 1006 of FIG. 10. In some embodiments, after defining the polygon 402, one or more other patterns of the target layout pattern are determined. The other patterns are shown in FIGS. 5A and 5B. A boundary of another pattern is not farther than a distance between about 200 nm to about 2000 nm from the boundary of disk shape of the target layout pattern. In operation S1108, a first error between the target layout pattern 404 of the opening and the projected first iteration of the resist pattern of the opening is determined. As shown in FIGS. 1B and 10, the first error is determined by the OPC verifier 140 of FIG. 1B or the mask verifier 1008 of FIG. 10. In operation S1110, the initial layout pattern of the opening is adjusted, based on the first error, to generate a next iteration of the layout pattern of the opening. As shown in FIGS. 1B and 10, the next iteration of the layout pattern of the opening is generated by the OPC enhancer 122 of FIG. 1B or the mask enhancer 1004 of FIG. 10. In some embodiments, a second adjusting of the initial layout pattern of the opening is performed by further moving one or more vertices of the polygon based on the one or more other patterns.

In operation S1112, the adjusting, the projecting, and the determining is continued until a criterion is satisfied. In some embodiments, the iterations continue until an error between the projected resist pattern and the target layout pattern 404 is less than or equal a threshold value. In some embodiments, a photo mask is created by disposing a final iteration of the layout pattern on a mask blank. In some embodiments, adjusting is performed by moving the vertices based on the amount of error. In some embodiments, the amount of adjusting the vertices is the same for all vertices. In some embodiments, different amounts of adjusting is performed for different vertices and the adjustment depends on the error and on an amount of a previous adjustment of the vertex.

Figure 12:
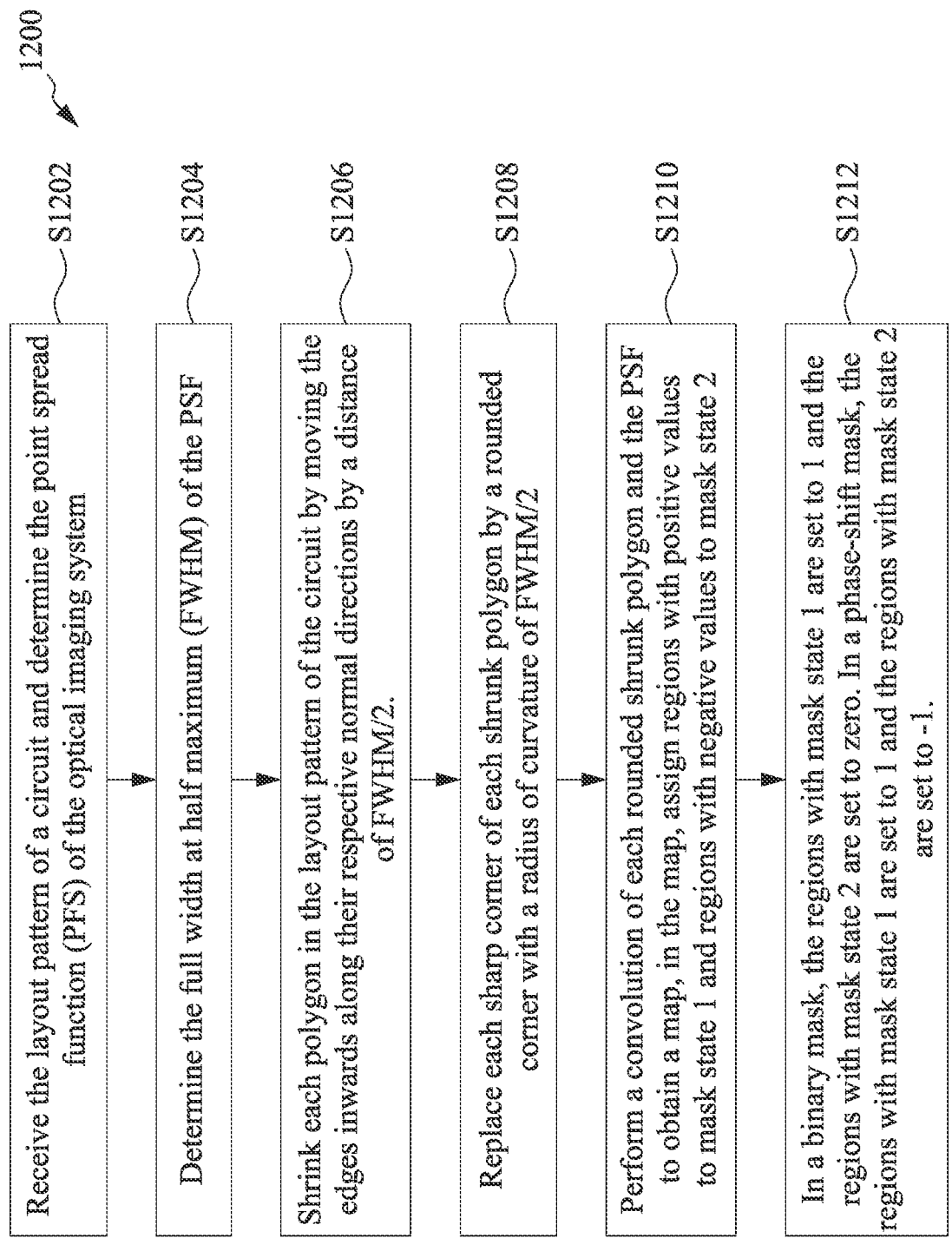
FIG. 12 illustrates a flow diagram of a process for determining sub-resolution assist features of layout patterns of a photo mask in accordance with some embodiments of the disclosure.

FIG. 12 illustrates a flow diagram of a process 1250 for determining sub-resolution assist features of layout patterns of a photo mask in accordance with some embodiments of the disclosure. The process 1250 may be performed by the system of FIG. 10. In some embodiments, the process 1250 or a portion of the process 1250 is performed and/or is controlled by the computer system 1200 described below with respect to FIGS. 15A and 15B. In some embodiments, the process 1250 is performed before the step S1106 of the process 1100 and after the step S1104 such that the layout pattern of step S1202 of process 1250 is the initial layout pattern of step S1104. The method includes the operation S1202 that the layout pattern of a circuit is received and the point spread function (PSF) of the imaging system of the photo lithographic system is determined. The method also includes the operation S1204 that the full width at half maximum (FWHM) of the PSF is determined. In some embodiments, as shown in FIG. 10, the analyzer module 1030 receives the layout pattern 1010 and the analyzer module 1030 performs the process 1300 described below to determine the PSF. In some embodiments, the PSF is an amplitude PSF and in some embodiments, the PSF is an intensity PSF.

In operation S1206, each polygon in the layout pattern of the circuit is shrunk by moving its edges inwards along their respective normal directions by a distance of FWHM/2. In some embodiments, the movement of the edges is performed by the analyzer module 1030. In some embodiments, the edges are shrunk in two perpendicular directions, e.g., along both the X-direction and along the Y-direction by the distance FWHM/2. In some embodiments, if a distance in the X-direction between two corresponding edges is less than the distance FWHM, the polygon becomes a single line in the Y-direction and if a distance in the Y-direction between two corresponding edges is less than the distance FWHM, the polygon becomes a single line in the X-direction. In some embodiments, if the distance in the X-direction between two corresponding edges is less than the distance FWHM and the distance in the Y-direction between two corresponding edges is less than the distance FWHM, the polygon becomes a single point. In operation S1208, each sharp corner of each shrunk polygon is replaced by a rounded corner with a radius of curvature of FWHM/2. As shown in FIG. 6E, the sharp vertex 601A of the polygon 650 is replaced by the curvature 407 where the curvature 407 is part of the circle 403 and the circle 403 has the radius FWHM/2. In some embodiments, the replacement of the sharp vertex 601A is performed by the analyzer module 1030. The replacement is performed at the other sharp corners, e.g., the vertices 601B, 601C, 601F, 601G, and 601H. In operation S1210, the convolution of each rounded shrunk polygon and the PSF is performed to obtain a map and in the map, regions with positive values are assigned to mask state 1 and regions with negative values are assigned to mask state 2. In operation S1212, for a binary mask: the regions with mask state 1 are set to 1 (clear) and the regions with mask state 2 are set to zero (dark). For a phase-shift mask, the regions with mask state 1 are set to 1 (clear with zero phase) and the regions with mask state 2 are set to −1 (clear with 180 degrees phase shift). In some embodiments, the mask state 1 includes the layout pattern of the mask, e.g., the target layout pattern. In some embodiments, the operations S1210 and S1212 are performed by the analyzer module 1030. In some embodiments, by the addition of the regions with mask states 1 and 2, a modified layout pattern is generated and the modified layout pattern is passed as the initial layout pattern to step S1106 of process 1100. Thus, the steps S1106, S1108, S1110, and S1112 are performed on the modified layout pattern. In some embodiments, the addition of the regions having mask state 1 and 2, generates one or more sub-resolution assist features around the layout pattern and the layout pattern with the sub-resolution assist features becomes the modified layout pattern.

FIG. 8A shows the layout pattern 810, which is the result of operations S1210 and S1212 for a binary mask. The layout pattern 710 that is set to 1 is the target layout pattern and the sub-resolution assist features 815 are set to zero and 1 for the binary pattern. FIG. 9A shows the layout pattern 910, which is the result of operations S1210 and S1212 for a phase-shift mask. The layout pattern 710 that is set to 1 is the target layout pattern and the sub-resolution assist features 915 and 925 are respectively set to 1 and −1 for the phase-shift pattern.

Figure 13:
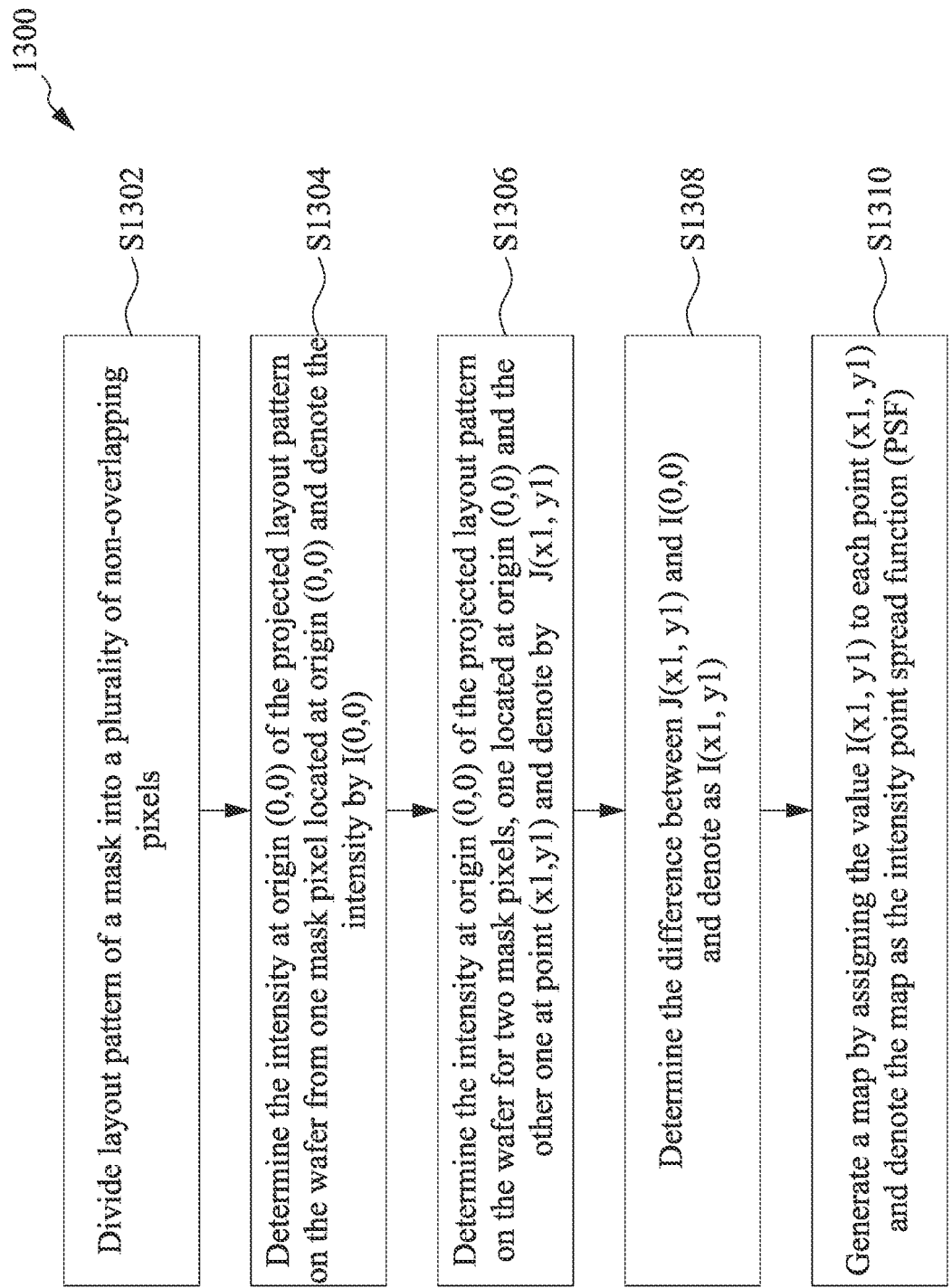
FIG. 13 illustrates a flow diagram of a process for determining intensity point spread function of the imaging system of the photo lithographic system in accordance with some embodiments of the disclosure.

FIG. 13 illustrates a flow diagram of a process 1300 for determining intensity point spread function of the imaging system of the photo lithographic system in accordance with some embodiments of the disclosure. The process 1300 may be performed by the system of FIG. 10. In some embodiments, the process 1300 or a portion of the process 1300 is performed and/or is controlled by the computer system 1200 described below with respect to FIGS. 15A and 15B. The method includes the operation S1302 that the layout patterns of a mask is divided into a plurality of non-overlapping pixels. At operation S1304, the intensity at origin (0,0) of the projected layout pattern on the wafer from one mask pixel located at origin (0,0) is determined and is denote by intensity by I(0, 0). At operation S1306, the intensity at origin (0,0) of the projected layout pattern on the wafer for two mask pixels, one located at origin (0,0) and the other one at point (x1,y1), is determined and is denoted by J(x1, y1). At operation S1308, the difference between J(x1, y1) and I(0,0) is determined and is denoted as I(x1, y1). At operation S1310, a map is generated by assigning the value I(x1, y1) to each point (x1, y1) and the map is denoted as the intensity point spread function.

Figure 14:
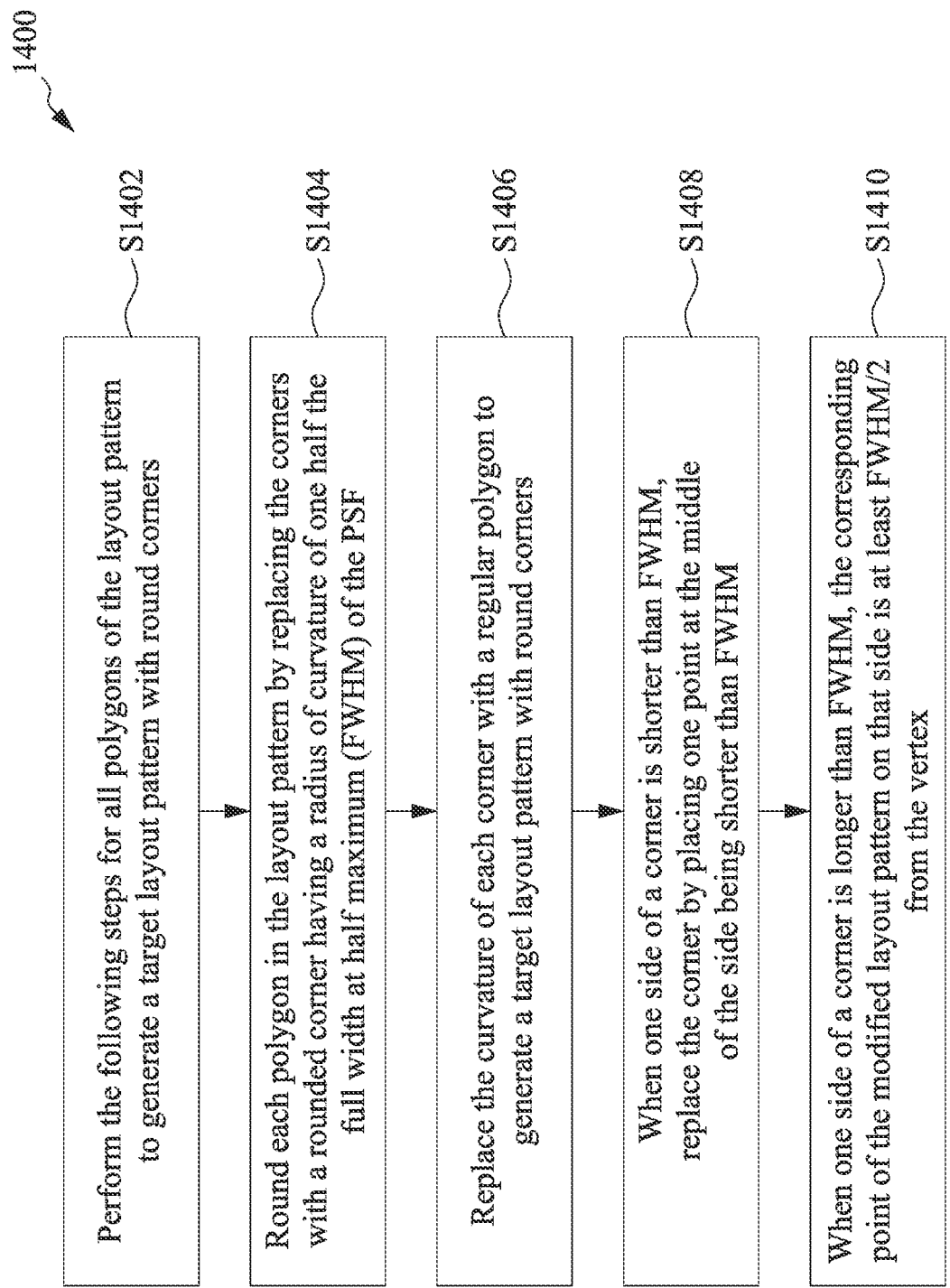
FIG. 14 illustrates a flow diagram of a process for smoothing corners of a layout pattern in accordance with some embodiments of the disclosure.

FIG. 14 illustrates a flow diagram of a process for smoothing corners of a layout pattern in accordance with some embodiments of the disclosure. The process 1400 may be performed by the system of FIG. 10. In some embodiments, the process 1400 or a portion of the process 1400 is performed and/or is controlled by the computer system 1200 described below with respect to FIGS. 15A and 15B. The operations of the process 1400 is performed for all the polygons of the layout pattern to generate a target layout pattern with round corners at S1402. The process includes the operation S1404 that each polygon in the layout pattern is rounded by replacing the corners with a rounded corner having a radius of curvature of one half the full width at half maximum (FWHM) of the PSF. At operation S1406, the curvature of each corner is replaced with a regular polygon to generate a target layout pattern with round corners. At operation S1408, when one side of a corner is shorter than FWHM, replacing the corner is performed by placing one point at the middle of the side being shorter than FWHM. At operation S1410, when one side of a corner is longer than FWHM, the corresponding point of the modified layout pattern on that side is at least FWHM/2 from the vertex. In some embodiments, as shown in FIG. 6E, one side of both vertices 601D and 601E, e.g., the side between the vertices 601D and 601E, is shorter than FWHM. Thus, the vertices 601D and 601E are replaced with a new vertex 603 between the vertices 601D and 601E. In some embodiments, as shown in FIG. 6E, both sides of vertices 601A, 601B, 601C, 601F, 601G, and 601H are longer than FWHM. Thus, each of the vertices is replaced by three new vertices 603.

Figure 15A:
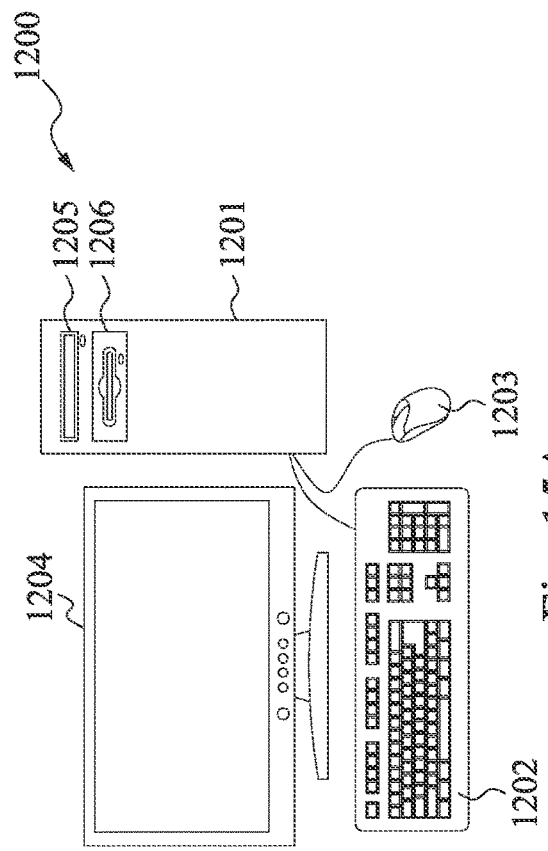
FIGS. 15A and 15B illustrate an apparatus for enhancing a photo mask in accordance with some embodiments of the disclosure.
Figure 15B:
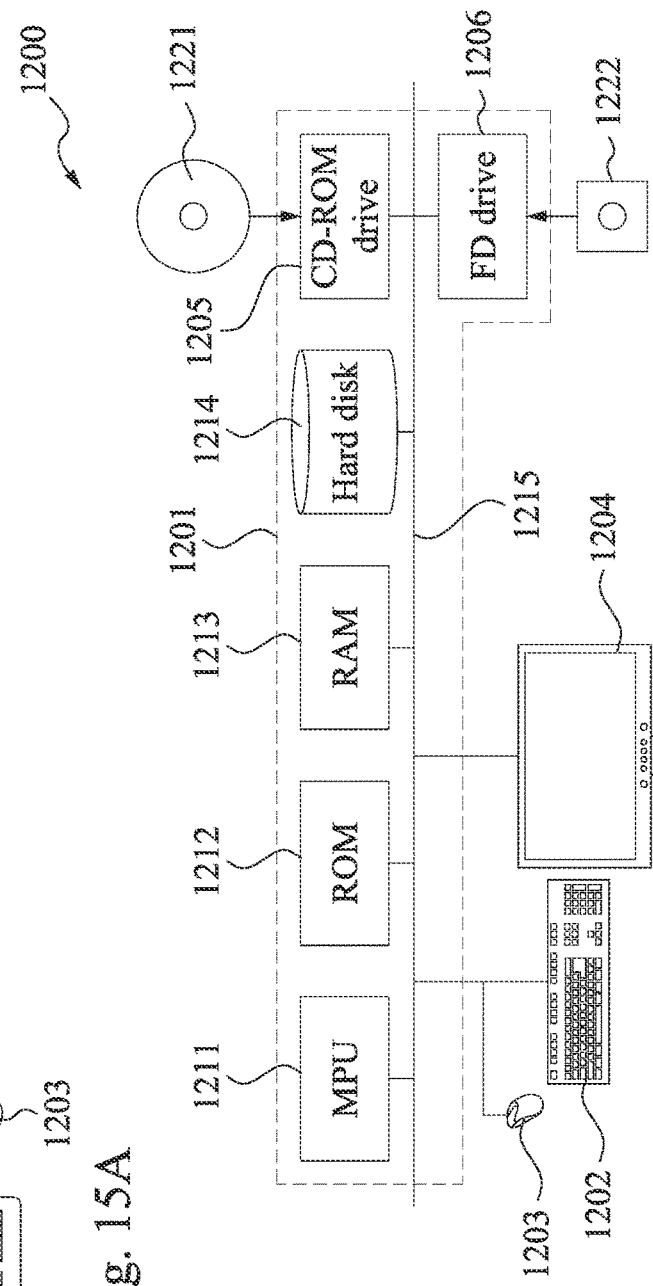

FIGS. 15A and 15B illustrate an apparatus for enhancing a photo mask in accordance with some embodiments of the disclosure. In some embodiments, the computer system 1200 is used for enhancing a photo mask. Thus, in some embodiments, the computer system 1200 performs the functions of the OPC enhancer 122, the optical simulator 130, and the OPC verifier 140 of FIG. 1B. In some embodiments, the computer system 1200 performs the functions of the analyzer module 1030, main controller 1040, the mask enhancer 1004, the mask projector 1006, and the mask verifier 1008 of FIG. 10. FIG. 15A is a schematic view of a computer system that performs the enhancing of a photo mask. All of or a part of the processes, method and/or operations of the foregoing embodiments can be realized using computer hardware and computer programs executed thereon. In FIG. 15A, a computer system 1200 is provided with a computer 1201 including an optical disk read only memory (e.g., CD-ROM or DVD-ROM) drive 1205 and a magnetic disk drive 1206, a keyboard 1202, a mouse 1203, and a monitor 1204.

FIG. 15B is a diagram showing an internal configuration of the computer system 1200. In FIG. 15B, the computer 1201 is provided with, in addition to the optical disk drive 1205 and the magnetic disk drive 1206, one or more processors, such as a micro processing unit (MPU), a ROM 1212 in which a program such as a boot up program is stored, a random access memory (RAM) 1213 that is connected to the MPU 1211 and in which a command of an application program is temporarily stored and a temporary storage area is provided, a hard disk 1214 in which an application program, a system program, and data are stored, and a bus 1215 that connects the MPU 1211, the ROM 1212, and the like. Note that the computer 1201 may include a network card (not shown) for providing a connection to a LAN.

The program for causing the computer system 1200 to execute the functions of an apparatus for performing the enhancement of a photo mask in the foregoing embodiments may be stored in an optical disk 1221 or a magnetic disk 1222, which are inserted into the optical disk drive 1205 or the magnetic disk drive 1206, and transmitted to the hard disk 1214. Alternatively, the program may be transmitted via a network (not shown) to the computer 1201 and stored in the hard disk 1214. At the time of execution, the program is loaded into the RAM 1213. The program may be loaded from the optical disk 1221 or the magnetic disk 1222, or directly from a network. The program does not necessarily have to include, for example, an operating system (OS) or a third party program to cause the computer 1201 to execute the functions of the photo mask data generating and merging apparatus in the foregoing embodiments. The program may only include a command portion to call an appropriate function (module) in a controlled mode and obtain desired results.

In some embodiments, inverse lithography technology (ILT) is used after OPC to further enhance the projected mask layout and further reduce the error between target layout pattern and the projected resist pattern. In some embodiments, a cost function is adapted as part of the error calculations or in place of the error calculations that includes a proper figure of merit, e.g., pattern fidelity, image log slope (ILS), depth of focus (DOF), mask error enhancement factor (MEEF), or any of their combinations. In some embodiments, loss of pattern fidelity of the OPC due to the optical proximity effect is resolved by the methods described with respect to using sub-resolution assist features and a larger process window may be used.

According to some embodiments of the present disclosure, a method of enhancing a layout pattern includes determining a target layout pattern including a disk shape associated with an opening to be produced over a substrate. The method includes defining a polygon having a plurality of vertices on the target layout pattern. The plurality of vertices of the polygon coincide with a boundary of the disk shape of the target layout pattern and the polygon is an initial layout pattern of the opening. The method includes determining one or more other patterns of the target layout pattern. The method also includes performing an iterative correction of the initial layout pattern until a criterion is satisfied. The iterative correction includes projecting the initial layout pattern of the opening as a first iteration of a layout pattern of the opening onto the substrate, determining a first error between the target layout pattern of the opening and the projected first iteration of the layout pattern of the opening, and first adjusting the initial layout pattern of the opening by moving one or more vertices of the polygon, based on the first error. The method includes second adjusting the initial layout pattern of the opening by further moving one or more vertices of the polygon based on the one or more other patterns to generate the next iteration of the layout pattern of the opening. The method further includes continue the projecting, the determining, the first adjusting, and the second adjusting until the criterion is satisfied and a final iteration of the layout pattern of the opening is generated. In an embodiment, the adjusting is performed based on the first error and the adjusting the initial layout pattern of the opening includes moving a first group of one or more vertices of the plurality of vertices inward from the boundary of the disk shape pattern and moving a second group of one or more vertices of the plurality of vertices outward from the boundary of the disk shape pattern. In an embodiment, the determining the disk shape associated with the opening includes receiving an initial target layout pattern that has a substantially square shape associated with the opening and determining a largest circle fitting inside the substantially square shape as the disk shape pattern associated with the opening. The method further includes producing a photo mask by disposing the final iteration of the layout pattern of the opening on a mask blank. In an embodiment, the polygon is a regular polygon having five or more vertices, and the criterion is satisfied when the first error is below a first threshold. In an embodiment, the first error between the target layout pattern of the opening and the projected first iteration of the layout pattern of the opening is defined as a distance between the boundary of the disk shape pattern of the target layout pattern and a boundary of the projected first iteration of the layout pattern of the opening, and the projecting is a simulated projection. In an embodiment, the adjusting the initial layout pattern of the opening includes that in each second adjusting, modifying the initial layout pattern of the opening by further moving inward one or more vertices of the polygon based on a different pattern of the one or more other patterns. In an embodiment, the method further includes: prior to performing the iterative correction, determining one or more sub-resolution assist features by performing: acquiring a point spread function (PSF) of the optical imaging system of the lithography system and determining a full width at half maximum (FWHM) of the PSF, shrinking the polygon in the final iteration of the layout pattern by moving edges inward along respective normal directions of the edges by a distance of FWHM/2, replacing each sharp corner of the shrunk polygon by a rounded corner with a radius of curvature of FWHM/2, and performing a convolution of the rounded shrunk polygon and the PSF to obtain a map. In the map, assigning regions with positive values to mask state 1 and regions with negative values to mask state 2. In an embodiment, in a binary mask when a positive-tone resist is used, the regions assigned to mask state 1 are set to clear and the regions assigned to mask state 2 are set to dark. Also, in the binary mask when a negative-tone resist is used, the regions assigned to mask state 1 are set to dark and the regions assigned to mask state 2 are set to clear. In an embodiment, in a phase-shift mask when a positive-tone resist is used, the regions assigned to mask state 1 are set to clear with zero phase shift and the regions assigned to mask state 2 are set to clear with 180 degrees phase shift. Also, in the phase-shift mask when a negative-tone resist is used, the regions assigned to mask state 1 are set to clear with 180 degrees phase shift and the regions assigned to mask state 2 are set to clear with zero phase shift. In an embodiment, the disk shape pattern is included in the mask state 1. In an embodiment, acquiring the PSF of the optical imaging system of the lithography system comprises: dividing the layout pattern into a plurality of non-overlapping pixels, determining an intensity at origin (0,0) of the projected layout pattern on a wafer from one mask pixel located at origin (0,0) and denote the intensity by I(0,0), determining the intensity at origin (0,0) of the projected layout pattern on the wafer for two mask pixels, one located at origin (0,0) and the other one at point (x1,y1) and denote by J(x1, y1), determining the difference between J(x1, y1) and I(0,0) and denote as I(x1, y1), and generating a map by assigning the value I(x1, y1) to each point (x1, y1) and denote the map as the point spread function (PSF).

According to some embodiments of the present disclosure, a method of enhancing a layout pattern includes receiving a target layout pattern associated with an opening to be produced on a substrate. The method incudes determining a regular polygon having a plurality of vertices inside the target layout pattern. The vertices are inside or on a perimeter of the target layout pattern, and the regular polygon is an initial layout pattern of the opening. The method also includes performing an iterative correction of the initial layout pattern. The iterative correction includes projecting the initial layout pattern as a first iteration of a layout pattern of the opening onto the substrate, determining a first error between the target layout pattern of the opening and the projected first iteration of the layout pattern of the opening, and adjusting the initial layout pattern of the opening by moving the vertices away from an initial location of the vertices to generate a next iteration of the layout pattern of the opening. The method further incudes continuing the adjusting, the projecting, and the determining until a criterion is satisfied and a final iteration of the layout pattern of the opening is generated and using substantially circularly symmetric illumination for the projecting. In an embodiment, the adjusting the initial layout pattern of the opening includes moving a first group of one or more vertices of the plurality of vertices inward from the perimeter of the target layout pattern, and moving a second group of one or more vertices of the plurality of vertices outward from the perimeter of the target layout pattern. In an embodiment, the first error between the target layout pattern of the opening and the projected first iteration of the layout pattern of the opening is defined as a distance between the perimeter of the target layout pattern and a boundary of the projected first iteration of the layout pattern of the opening. The criterion is satisfied when the first error is below a first threshold.

According to some embodiments of the present disclosure, a layout pattern enhancement system include a main controller, a mask enhancer coupled to the main controller, a mask projector coupled to the main controller, and an analyzer module coupled to the main controller. The analyzer module receives a target layout pattern to be produced on a substrate. The analyzer module also receives a command from the main controller to parse the target layout pattern to determine a first sub-pattern of the target layout pattern that includes a rectangular shape having one or two substantially line-end shapes at one or both ends of the rectangular shape. The analyzer module fits one or two arc shapes inside the rectangular shape to the one or two substantially line-end shapes and replaces the one or two substantially line-end shapes of the first sub-pattern of the target layout pattern with the one or two arc shapes. The mask enhancer is coupled to the analyzer module through the main controller and receives the first sub-pattern from the analyzer module and defines a portion of a regular polygon having a plurality of vertices on a first arc shape of the one or two arc shapes at a first end of the rectangular shape. The plurality of vertices of the portion of the regular polygon coincide with a boundary of the first arc shape at the first end of the rectangular shape of the first sub-pattern of the target layout pattern, and the portion of the regular polygon is an initial layout pattern of the first end of the rectangular shape of the first sub-pattern. Also, the mask projector projects, onto the substrate, the initial layout pattern as a first iteration of a layout pattern of the first end of the rectangular shape of the first sub-pattern. The analyzer module further determines a first error between the target layout pattern of the first end of the rectangular shape of the first sub-pattern and the projected first iteration of the first end of the rectangular shape of the first sub-pattern. And, the mask enhancer adjusts the initial layout pattern by moving the vertices away from the boundary of the first arc shape to generate a next iteration of the layout pattern of the first end of the rectangular shape of the first sub-pattern. Also, the main controller continues the adjusting, the projecting, and the determining until the first error is below an error threshold and a final iteration of the layout pattern of the first end of the rectangular shape of the first sub-pattern is generated. In an embodiment, the first sub-pattern of the target layout pattern is a connection line, and the mask enhancer further receives a command from the main controller to perform optical proximity correction of edges of the rectangular shape of the first sub-pattern. In an embodiment, the one or two arc shapes are semicircles, and layout pattern enhancement is performed at both ends of the rectangular shape of the first sub-pattern. In an embodiment, the system further includes a mask projection system for facilitating a production of the first sub-pattern on a photo mask. In an embodiment, the adjusting the initial layout pattern includes moving a first group of one or more vertices of the plurality of vertices inward from the boundary the first arc shape, and moving a second group of one or more vertices of the plurality of vertices outward from the boundary the first arc shape. In an embodiment, the first error between the target layout pattern of the first end of the rectangular shape of the first sub-pattern and the projected first iteration of the first end of the rectangular shape of the first sub-pattern is defined as a distance between the boundary of the first arc shape of the first sub-pattern and a boundary of the projected first iteration of the first end of the rectangular shape of the first sub-pattern; and the projecting is a simulated projection.

In some embodiments, implementing the processes and methods mentioned above, adapts the target layout pattern to a modified target layout pattern that resembles the shape of the PSF of the lithographic system and the produced resist pattern has the shape of the modified target layout pattern.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   determining a target layout pattern comprising one or more first curvatures to be produced over a substrate;
   defining one or more partial polygons having a plurality of vertices on the one or more first curvatures of the target layout pattern, wherein the plurality of vertices of the one or more partial polygons coincide with a boundary of the one or more first curvatures in the target layout pattern, and wherein the one or more partial polygons are part of an initial layout pattern; and
   performing an iterative correction of the initial layout pattern until a criterion is satisfied and a final layout pattern for the target layout pattern is generated, wherein the iterative correction comprises:
      projecting, onto the substrate, the initial layout pattern as a first iteration of a layout pattern;
      determining a first error between the target layout pattern and the first iteration of the layout pattern; and
      adjusting the initial layout pattern by moving one or more vertices of the plurality of vertices based on the first error; and
   continue the projecting, the determining, and the adjusting until the criterion is satisfied and the final layout pattern for the target layout pattern is generated.

2. The method of claim 1, wherein the adjusting the initial layout pattern comprises:
   moving a first group of one or more vertices of the plurality of vertices inward from the boundary of the one or more first curvatures towards centers of corresponding first curvatures; and
   moving a second group of one or more vertices of the plurality of vertices outward from the boundary of the one or more first curvatures away from centers of corresponding first curvatures.

3. The method of claim 1, wherein the determining the one or more first curvatures comprises:
   receiving an initial target layout pattern comprising one or more semi-squares having a sharp corner; and
   determining one or more curvatures fitting inside the one or more semi-squares as the one or more first curvatures of the target layout pattern, and
   the method further comprises:
   producing a photo mask by disposing the final layout pattern on a mask blank.

4. The method of claim 1, wherein at least one of the one or more partial polygons is a portion of a regular polygon having three or more vertices, and wherein the criterion is satisfied when the first error is below a first threshold.

5. The method of claim 1, wherein the first error between the target layout pattern and the first iteration of the layout pattern is defined as a distance between the boundary of the target layout pattern and a boundary of the first iteration of the layout pattern, and wherein the projecting is a simulated projection.

6. The method of claim 1, wherein the adjusting the initial layout pattern further comprises:
   second adjusting the initial layout pattern by further moving inward one or more vertices of the one or more partial polygons based on one or more other pattern in a vicinity of the target layout pattern.

7. The method of claim 1, further comprising:
   prior to performing the iterative correction, determining one or more sub-resolution assist features by:
   acquiring a point spread function (PSF) of an optical imaging system of a lithography system and determining a full width at half maximum (FWHM) of the PSF;
   shrinking at least a partial polygon of the one or more partial polygons by moving edges of the polygon inward along respective normal directions of the edges by a distance of FWHM/2 towards a center of the polygon;
   replacing each sharp corner of the shrunk polygon by a rounded corner with a radius of curvature of FWHM/2; and
   performing a convolution of the rounded shrunk polygon and the PSF to obtain a map, wherein in the map, assign regions with positive values to a mask state 1 and regions with negative values to a mask state 2, wherein the one or more first curvatures are included in the mask state 1.

8. The method of claim 7, wherein in a phase-shift mask when a positive-tone resist is used, the regions assigned to the mask state 1 are set to clear with zero phase shift and the regions assigned to the mask state 2 are set to clear with 180 degrees phase shift, and wherein in the phase-shift mask when a negative-tone resist is used, the regions assigned to the mask state 1 are set to clear with 180 degrees phase shift and the regions assigned to the mask state 2 are set to clear with zero phase shift.

9. The method of claim 7, wherein acquiring the PSF of the optical imaging system of the lithography system comprises:
   dividing a layout pattern into a plurality of non-overlapping pixels;
   first determining an intensity at origin (0,0) of a projected layout pattern on a wafer from one mask pixel located at origin (0,0), wherein denote the intensity by I(0,0);
   second determining the intensity at origin (0,0) of the projected layout pattern on the wafer for two mask pixels, one located at origin (0,0) and another one at a point (x1,y1) and denote by J(x1, y1);
   third determining a difference between J(x1, y1) and I(0,0) and an intensity difference and denote by I(x1, y1); and
   generating a map by repeating the first determining, the second determining, and the third determining for other points and assigning the intensity differences to the other points and denoting the map as the point spread function (PSF).

10. A method comprising:
    determining a target layout pattern to be produced over a substrate, wherein the target layout pattern comprises a first target layout pattern that comprises one or more arc shapes and a second target layout pattern at a vicinity of the first target layout pattern;
    defining one or more partial polygons having a plurality of vertices inside the first target layout pattern, wherein the plurality of vertices of the one or more partial polygons are on the one or more arc shapes on a perimeter of the first target layout pattern or are inside the perimeter of the first target layout pattern, and wherein the one or more partial polygons are part of an initial layout pattern; and
    performing an iterative correction of the initial layout pattern until a criterion is satisfied and a final layout pattern for the first target layout pattern is generated, wherein the iterative correction comprises:
    projecting, onto the substrate, the initial layout pattern as a first iteration of a layout pattern;
    determining a first error between the first target layout pattern and the first iteration of the layout pattern;
    first adjusting the initial layout pattern by moving a first set of one or more vertices of the plurality of vertices based on the first error;
    second adjusting the initial layout pattern by further moving a second set of one or more vertices of the plurality of vertices based the second target layout pattern to generate the next iteration of the layout pattern; and
    continue the projecting, the determining, the first adjusting, and the second adjusting until the criterion is satisfied and the final layout pattern for the first target layout pattern is generated.

11. The method of claim 10, wherein the first adjusting the initial layout pattern comprises:
    moving a first group of one or more vertices of the plurality of vertices inward from the perimeter of the target layout pattern towards centers of corresponding arc shapes; and
    moving a second group of one or more vertices of the plurality of vertices outward from the perimeter of the target layout pattern away from centers of corresponding arc shapes.

12. The method of claim 10, wherein:
    the first error between the target layout pattern and the first iteration of the layout pattern is defined as a distance between the perimeter of the target layout pattern and a perimeter of the first iteration of the layout pattern,
    at least one of the one or more partial polygons is a portion of a regular polygon having three or more vertices, and
    the criterion is satisfied when the first error is below a first threshold.

13. The method of claim 10, further comprising:
    prior to performing the iterative correction, determining one or more sub-resolution assist features by:
    acquiring a point spread function (PSF) of an optical imaging system of a lithography system and determining a full width at half maximum (FWHM) of the PSF;
    shrinking at least a partial polygon of the one or more partial polygons by moving edges of the polygon inward along respective normal directions of the edges by a distance of FWHM/2 towards a center of the polygon;
    replacing each sharp corner of the shrunk polygon by a rounded corner with a radius of curvature of FWHM/2; and
    performing a convolution of the rounded shrunk polygon and the PSF to obtain a map, wherein in the map, assign regions with positive values to a mask state 1 and regions with negative values to a mask state 2.

14. The method of claim 13, wherein in a binary mask when a positive-tone resist is used, the regions assigned to the mask state 1 are set to clear and the regions assigned to the mask state 2 are set to dark, and wherein in the binary mask when a negative-tone resist is used, the regions assigned to the mask state 1 are set to dark and the regions assigned to the mask state 2 are set to clear.

15. A method, comprising:
receiving a layout pattern that comprises one or more sharp vertices;
replacing each sharp vertex of the layout pattern with an arc shape to produce a target layout pattern be produced over a substrate;
defining one or more partial polygons having a plurality of vertices on the one or more arc shapes of the target layout pattern, wherein the plurality of vertices of the one or more partial polygons coincide with a boundary of the one or more shapes in the target layout pattern, and wherein the one or more partial polygons are part of an initial layout pattern; and
performing an iterative correction of the initial layout pattern until a criterion is satisfied and a final layout pattern for the target layout pattern is generated, wherein the iterative correction comprises:
projecting, onto the substrate, the initial layout pattern as a first iteration of a layout pattern;
determining a first error between the target layout pattern and the first iteration of the layout pattern; and
adjusting the initial layout pattern by moving one or more vertices of the plurality of vertices based on the first error; and
continue the projecting, the determining, the adjusting until the criterion is satisfied and the final layout pattern for the target layout pattern is generated.

16. The method of claim 15, wherein the layout pattern comprises a connection line, wherein the one or more sharp vertices are at one or both ends of a rectangular shape of the connection line, the method further comprising:
performing optical proximity correction at the one or both ends of the connection line.

17. The method of claim 16, wherein the one or more arc shapes of the target layout pattern are semicircles, and wherein layout pattern enhancement is performed at both ends of the connection line.

18. The method of claim 16, wherein the first error between the target layout pattern of the one or both ends of the connection line and the first iteration of the one or both ends of the connection line is defined as a distance between the boundary of the one or more arc shapes of the target layout pattern and a boundary of the first iteration of the one or both ends of the connection line, and wherein the projecting is a simulated projection.

19. The method of claim 15, further comprising:
producing the target layout pattern on a photo mask.

20. The method of claim 15, wherein the adjusting the initial layout pattern comprises:
moving a first group of one or more vertices of the plurality of vertices inward from the boundary of the one or more arc shapes towards centers of corresponding arc shapes; and
moving a second group of one or more vertices of the plurality of vertices outward from the boundary of the one or more arc shapes away from centers of corresponding arc shapes.

* * * * *